(12) United States Patent
Subramanian et al.

(10) Patent No.: US 11,410,293 B2
(45) Date of Patent: *Aug. 9, 2022

(54) SYSTEM AND METHOD FOR USING IMAGES FROM A COMMODITY CAMERA FOR OBJECT SCANNING, REVERSE ENGINEERING, METROLOGY, ASSEMBLY, AND ANALYSIS

(71) Applicant: Photogauge, Inc., Alamo, CA (US)

(72) Inventors: Sankara J. Subramanian, Chennai (IN); Azhar H. Khan, Alamo, CA (US); Sameer Sharma, Chennai (IN); Arunachalam Muthukaruppan, Chennai (IN)

(73) Assignee: PHOTOGAUGE, INC., Alamo, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 17/128,141

(22) Filed: Dec. 20, 2020

(65) Prior Publication Data

US 2021/0110529 A1 Apr. 15, 2021

Related U.S. Application Data

(63) Continuation of application No. 16/023,449, filed on Jun. 29, 2018, now Pat. No. 10,885,622.

(51) Int. Cl.
*G06T 7/00* (2017.01)
*G06T 7/30* (2017.01)
(Continued)

(52) U.S. Cl.
CPC ............ *G06T 7/0004* (2013.01); *G06F 30/17* (2020.01); *G06T 7/30* (2017.01); *G06V 20/20* (2022.01)

(58) Field of Classification Search
CPC ......... G06T 7/0004; G06T 7/30; G06T 7/579; G06F 30/17; G06V 20/20; G06V 20/17;
(Continued)

(56) References Cited

U.S. PATENT DOCUMENTS

| 5,530,652 | A | 6/1996 | Croyle |
| 5,621,811 | A | 4/1997 | Roder |

(Continued)

FOREIGN PATENT DOCUMENTS

GB 2406657 4/2005

OTHER PUBLICATIONS

Ahmadabadian, Ali Hosseininaveh, R. Yazdan, A. Karami, M. Moradi, and F. Ghorbani. "Clustering and selecting vantage images in a low-cost system for 3D reconstruction of texture-less objects." Measurement 99 (2017): 185-191. (Year: 2017).

(Continued)

*Primary Examiner* — Carol Wang
(74) *Attorney, Agent, or Firm* — Inventive Law Inc.; Jim H. Salter

(57) ABSTRACT

A system and method for using images from a commodity camera for object scanning, reverse engineering, metrology, assembly, and analysis are disclosed. A particular embodiment includes a mobile imaging system to: enable a user to align an object to be analyzed on a turntable with a stencil; issue commands, by use of a data processor, to the turntable for automatic rotation of the turntable and the object thereon to a particular orientation for a camera of a mobile imaging device; capture a plurality of images of the object being analyzed at different automatic rotations of the turntable; upload the plurality of images of the object to a server via a network interface and a data network; and cause the server to generate a three dimensional (3D) model of the object from the plurality of images of the object.

20 Claims, 22 Drawing Sheets

(51) Int. Cl.
*G06F 30/17* (2020.01)
*G06V 20/20* (2022.01)

(58) Field of Classification Search
CPC ... G06V 10/245; G06V 2201/12; G01B 11/24
See application file for complete search history.

(56) References Cited

U.S. PATENT DOCUMENTS

| | | | |
|---|---|---|---|
| 6,259,815 | B1 | 7/2001 | Anderson |
| 6,795,194 | B2 | 9/2004 | Pallingen |
| 8,233,665 | B2 | 7/2012 | Nakatsukasa |
| 8,923,555 | B2 | 12/2014 | Inomata |
| 9,430,850 | B1 | 8/2016 | Domanski |
| 9,778,023 | B2 | 10/2017 | Osaki |
| 10,060,857 | B1 | 8/2018 | Bouchard |
| 10,885,622 | B2 | 1/2021 | Subramanian |
| 2002/0031223 | A1 | 3/2002 | Knighton |
| 2002/0033955 | A1 | 3/2002 | Knighton |
| 2002/0050988 | A1 | 5/2002 | Petrov |
| 2002/0118874 | A1 | 8/2002 | Chung |
| 2003/0218607 | A1 | 11/2003 | Baumberg |
| 2004/0017883 | A1 | 1/2004 | Takagi |
| 2004/0126002 | A1 | 7/2004 | Chang |
| 2005/0128551 | A1 | 6/2005 | Yang |
| 2006/0210076 | A1 | 9/2006 | Knighton |
| 2006/0221351 | A1 | 10/2006 | Yu |
| 2007/0285537 | A1 | 12/2007 | Dwinell |
| 2010/0118027 | A1 | 5/2010 | Weiss |
| 2011/0096896 | A1 | 4/2011 | Kunzmann |
| 2012/0105867 | A1 | 5/2012 | Komatsu |
| 2012/0314040 | A1 | 12/2012 | Kopf |
| 2013/0155187 | A1 | 6/2013 | Skyberg |
| 2013/0258045 | A1 | 10/2013 | Wojciech |
| 2014/0363048 | A1 | 12/2014 | Vrcelj |
| 2016/0073095 | A1 | 3/2016 | Ogura |
| 2016/0123893 | A1 | 5/2016 | Klaas |
| 2016/0124435 | A1 | 5/2016 | Thompson |
| 2016/0156829 | A1 | 6/2016 | Takamori |
| 2016/0327383 | A1 | 11/2016 | Becker |
| 2016/0371542 | A1 | 12/2016 | Sugita |
| 2017/0176226 | A1 | 6/2017 | Dockrey |
| 2017/0185226 | A1 | 6/2017 | Matsumura |
| 2018/0309976 | A1 | 10/2018 | Mun |
| 2018/0350148 | A1 | 12/2018 | George |
| 2019/0128670 | A1 | 5/2019 | Chen |
| 2019/0143523 | A1 | 5/2019 | Harel |
| 2020/0005422 | A1 | 1/2020 | Subramanian |
| 2020/0005448 | A1 | 1/2020 | Subramanian |

OTHER PUBLICATIONS

Ishida, Kasei. "Investigating the accuracy of 30 models created using SfM." In ISARC. Proceedings of the International Symposium on Automation and Robotics in Construction, vol. 34. IAARC Publications, 2017. (Year: 2017).

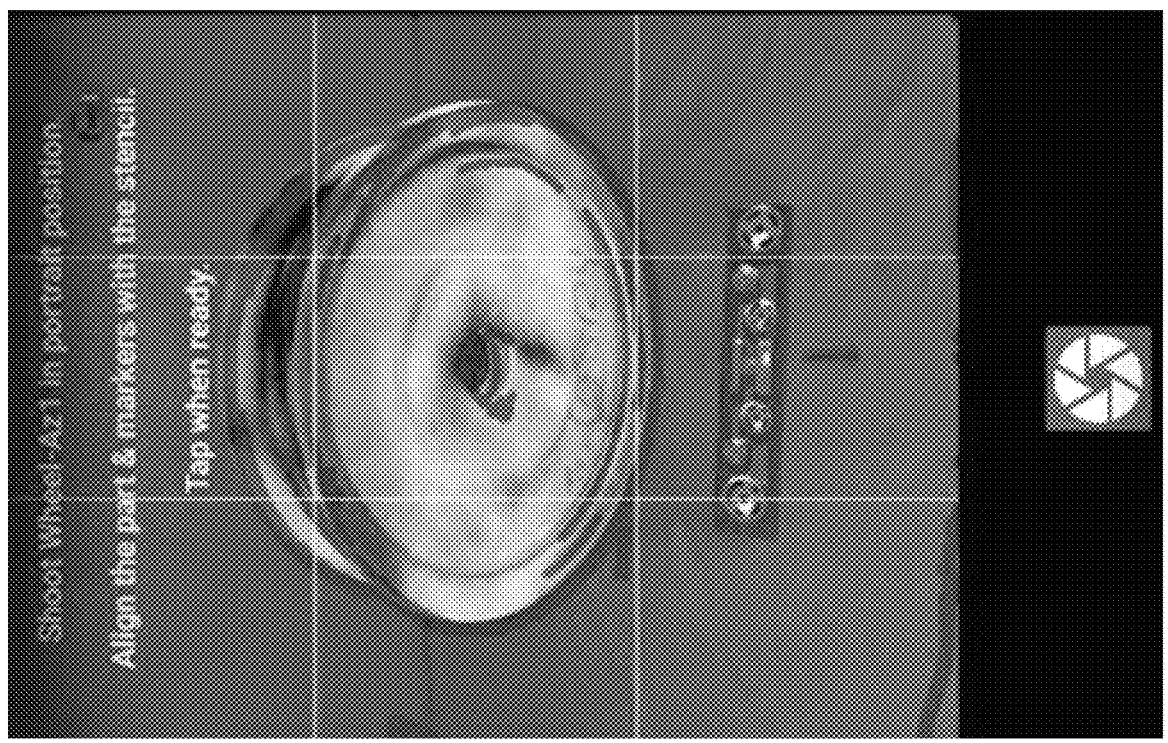
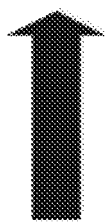
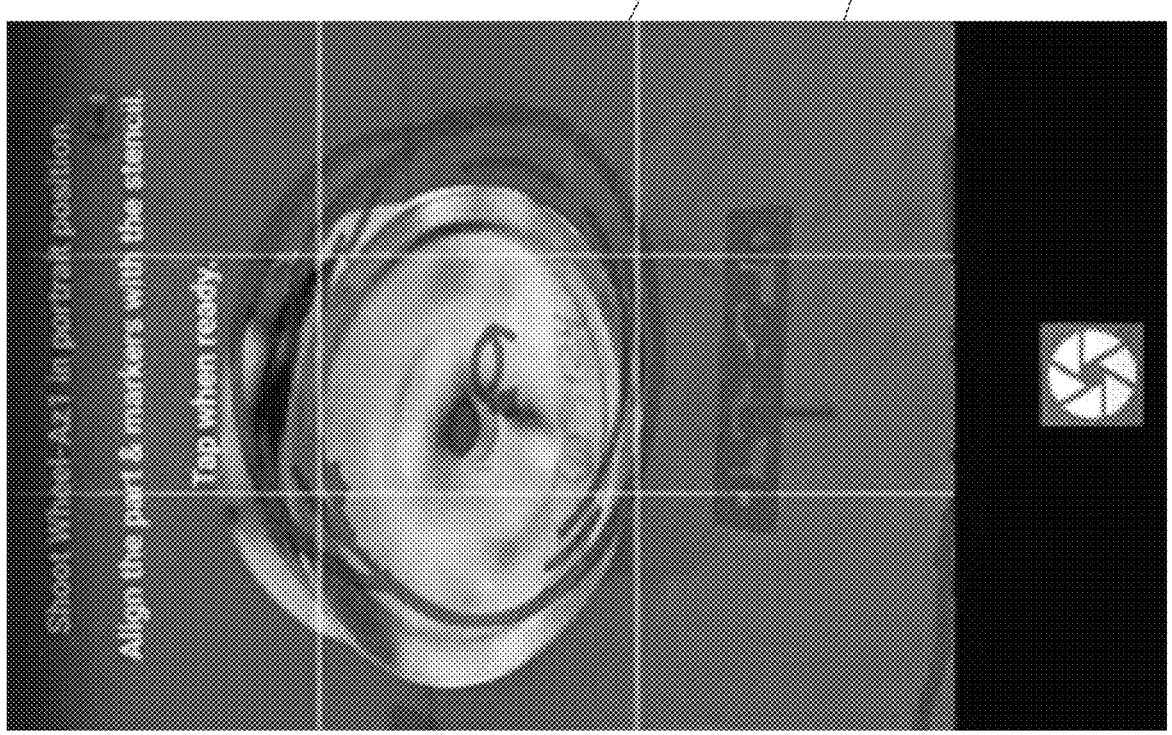
Fig. 11

SYSTEM AND METHOD FOR USING IMAGES FROM A COMMODITY CAMERA FOR OBJECT SCANNING, REVERSE ENGINEERING, METROLOGY, ASSEMBLY, AND ANALYSIS

PRIORITY PATENT APPLICATION

This patent application is a continuation patent application drawing priority from U.S. non-provisional patent application Ser. No. 16/023,449; filed Jun. 29, 2018. This present non-provisional patent application draws priority from the referenced patent application. The entire disclosure of the referenced patent application is considered part of the disclosure of the present application and is hereby incorporated by reference herein in its entirety.

COPYRIGHT

A portion of the disclosure of this patent document contains material that is subject to copyright protection. The copyright owner has no objection to the facsimile reproduction of the patent document or the patent disclosure, as it appears in the Patent and Trademark Office patent files or records, but otherwise reserves all copyright rights whatsoever. The following notice applies to the disclosure as described below and to the drawings that form a part of this document: Copyright 2016-2020 Photogauge, Inc., All Rights Reserved.

TECHNICAL FIELD

This patent application relates to computer-implemented software systems, mobile device imaging systems, and object metrology and analysis systems, according to one embodiment, and more specifically to a system and method for using images from a commodity camera for object scanning, reverse engineering, metrology, assembly, and analysis.

BACKGROUND

Measurement and analysis instruments using machine vision technology are widely used in quality assurance for parts and assemblies of machines, medical devices, and semiconductor products, etc. Most commercially available machine vision systems for dimensional measurement are desktop-sized or larger. In general, such systems lack mobility and flexibility given that a large percentage of dimensional measurements are manually performed in workshops, office spaces, and at other sites remote from convenient desktop-sized machine vision metrology system access. However, conventional mobile imaging systems lack the precision and resolution necessary to produce accurate measurements and defect detection for objects with complex shapes.

SUMMARY

In various example embodiments described herein, a system and method for using images from a commodity camera for object scanning, reverse engineering, metrology, assembly, and analysis are disclosed. In the various example embodiments described herein, a computer-implemented device including a software application (app) as part of a mobile imaging system is described to automate and improve object measurement and analysis processes. As described in more detail below, a computer or computing system on which the described embodiments can be implemented can include personal computers (PCs), portable computing devices, laptops, tablet computers, personal digital assistants (PDAs), personal communication devices (e.g., cellular telephones, smartphones, or other wireless devices), network computers, consumer electronic devices, or any other type of computing, data processing, communication, networking, or electronic system. An example embodiment can also use a non-specialty camera, such as any commodity camera including a mobile phone camera, a mobile phone attachment for image capture, a fixed-lens rangefinder camera, a digital single-lens reflex (DSLR) camera, an industrial machine vision camera, a drone camera, a helmet camera, or the like. The commodity camera is used to acquire images of an object or many objects, from which the mobile imaging system can generate the three-dimensional (3D) geometry of the object, and provide any of a number of outputs as described in more detail below.

The mobile imaging system of the various example embodiments described herein provides a system to automatically image a part/object to be analyzed or guide the user with the part/object to be analyzed and to automatically take photos or images of the part/object. In one example embodiment, the mobile imaging system provides a stencil based guidance system to guide the user with a part/object to be analyzed and to automatically take photos or images of the part/object after matching a stencil with the part/object. In other embodiments, the mobile imaging system can acquire multiple images of the object or objects, some of which may also contain one or more calibration bars. The object(s) may be imaged in a special enclosure or in an environment with a background of a specific color. Alternatively, the object(s) may be imaged in their natural environments. Irrespective of whether images are obtained using the same camera or multiple cameras, the images are processed in a similar way. In one embodiment, images of the object or objects, which may or may not have special markers attached to them, can be captured in different poses using a single camera or multiple cameras by rotating or translating the object on a moving platform, such as a manual or automatic turntable, a drone, a robot, a robotic-arm, or by manually moving the camera and capturing images from different camera locations. In the example embodiments, the mobile imaging system can analyze the images of the object for focus, lighting, and contrast, and apply an object bounding box around the object. The images can be uploaded to a server in a network cloud. The server can generate a three dimensional (3D) model of the object from the images of the object. The server can generate measurements of the edges and surfaces or other metrology results of the object from the 3D model and/or the object images. The server can also generate information related to object point scans, object reverse engineering data, object assembly guidance, and object analysis. The metrology results and other output related to the object as generated by the mobile imaging system of the various example embodiments can be provided to a user via a mobile device, email, web browser, or other presentation platform as described in more detail below.

BRIEF DESCRIPTION OF THE DRAWINGS

The various embodiments are illustrated by way of example, and not by way of limitation, in the figures of the accompanying drawings in which:

FIG. 11 illustrates an example embodiment wherein stencils can be used to guide the user to properly align the object and calibration bar;

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

In various example embodiments described herein, a system and method for using images from a commodity camera for object scanning, reverse engineering, metrology, assembly, and analysis are disclosed. In the various example embodiments described herein, a computer-implemented device including a software application (app) as part of a mobile imaging system is described to automate and improve object measurement and analysis processes. As described in more detail below, a computer or computing system on which the described embodiments can be implemented can include personal computers (PCs), portable computing devices, laptops, tablet computers, personal digital assistants (PDAs), personal communication devices (e.g., cellular telephones, smartphones, or other wireless devices), network computers, consumer electronic devices, or any other type of computing, data processing, communication, networking, or electronic system. An example embodiment can also use a non-specialty camera, such as any commodity camera including a mobile phone camera, a mobile phone attachment for image capture, a fixed-lens rangefinder camera, a digital single-lens reflex (DSLR) camera, an industrial machine vision camera, a drone camera, a helmet camera, or the like. The commodity camera is used to acquire images of an object or many objects, from which the mobile imaging system can generate the three-dimensional (3D) geometry of the object, and provide any of a number of outputs as described in more detail below.

Figure 1:
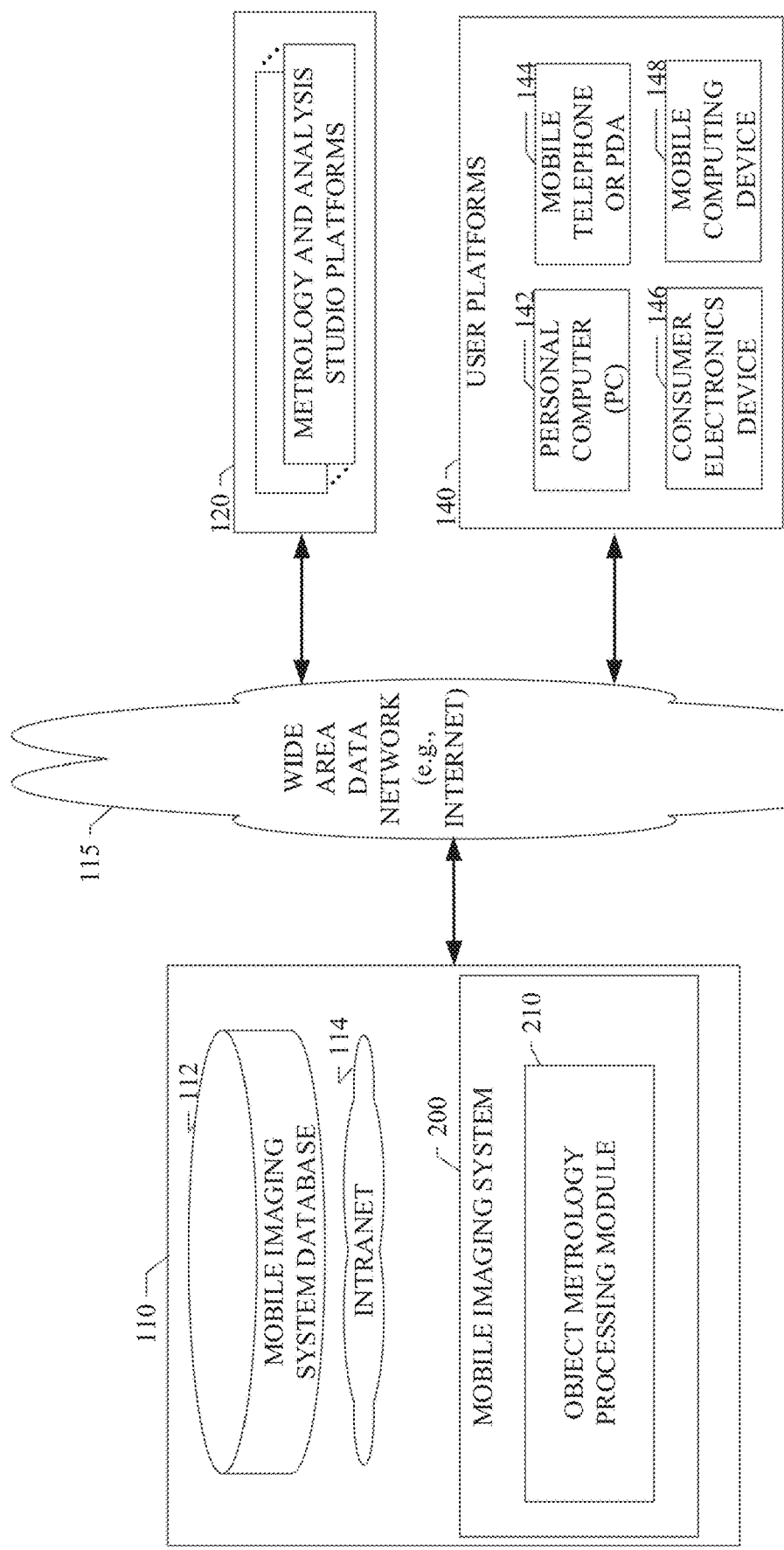
FIG. 1 illustrates an example embodiment of a networked system in which various embodiments may operate.

FIG. 1, in an example embodiment, illustrates a system and method for using images from a commodity camera for object scanning, reverse engineering, metrology, assembly, and analysis. In various example embodiments, an application or service, typically provided by or operating on a host site (e.g., a website) 110, is provided to simplify and facilitate the downloading or hosted use of the mobile imaging system 200 of an example embodiment. In a particular embodiment, the mobile imaging system 200, or portions thereof, can be downloaded from the host site 110 by a user at a user platform 140. Alternatively, the mobile imaging system 200 can be hosted by the host site 110 for a networked user at a user platform 140. The details of the mobile imaging system 200 for an example embodiment are provided below.

Figure 2:
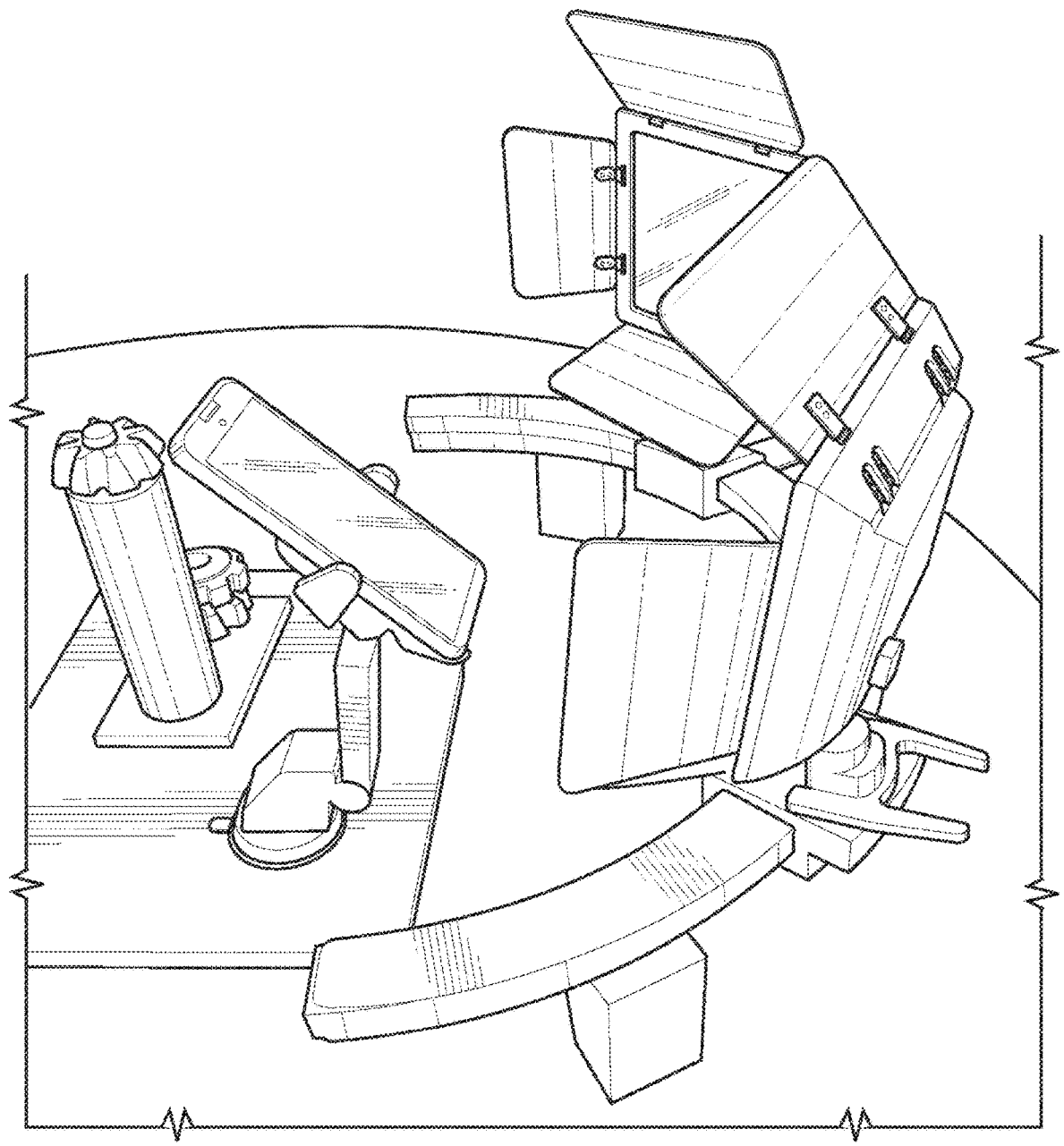
FIGS. 2 through 4 illustrate example embodiments of the metrology and analysis studio platform.
Figure 3:
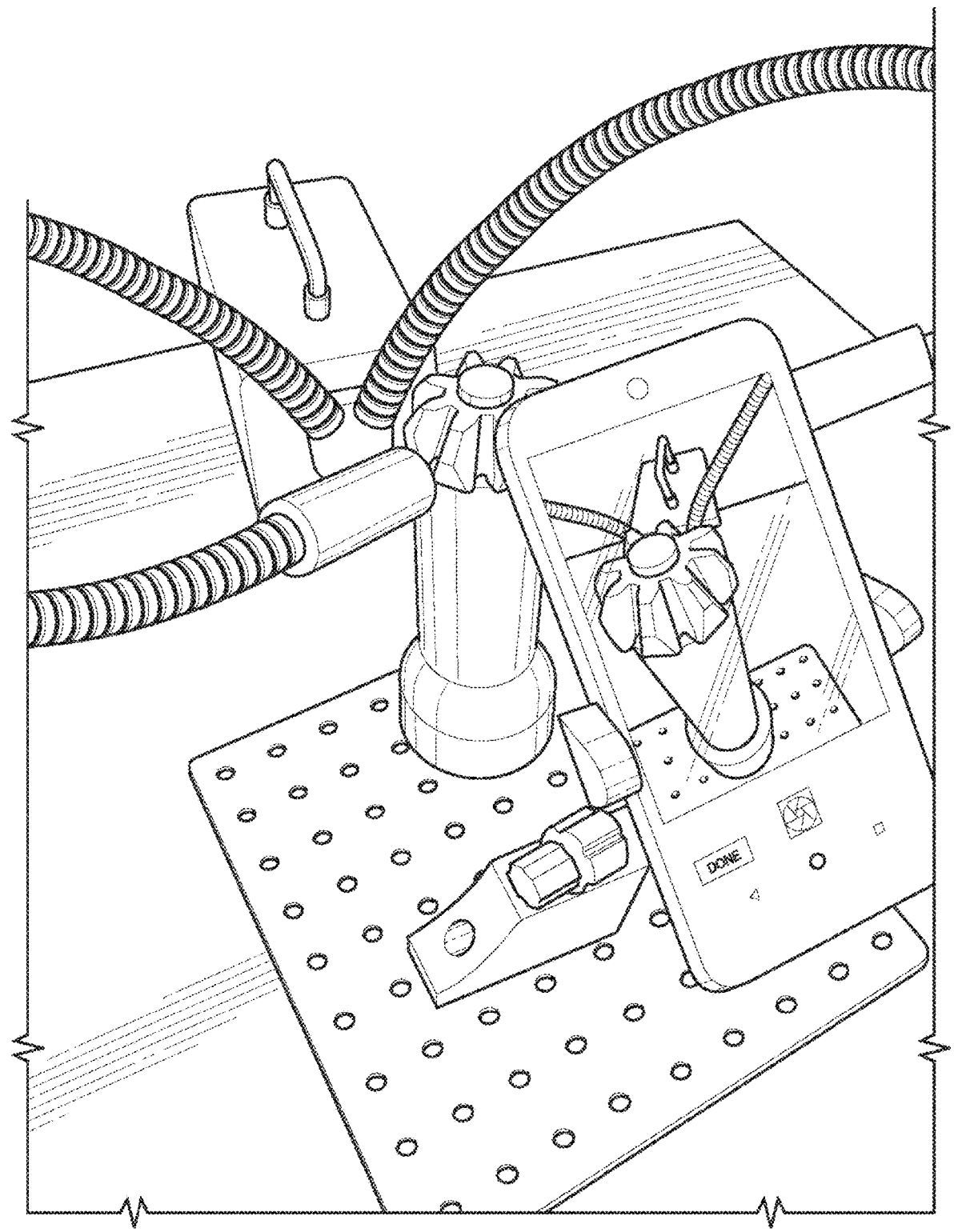
Figure 4:
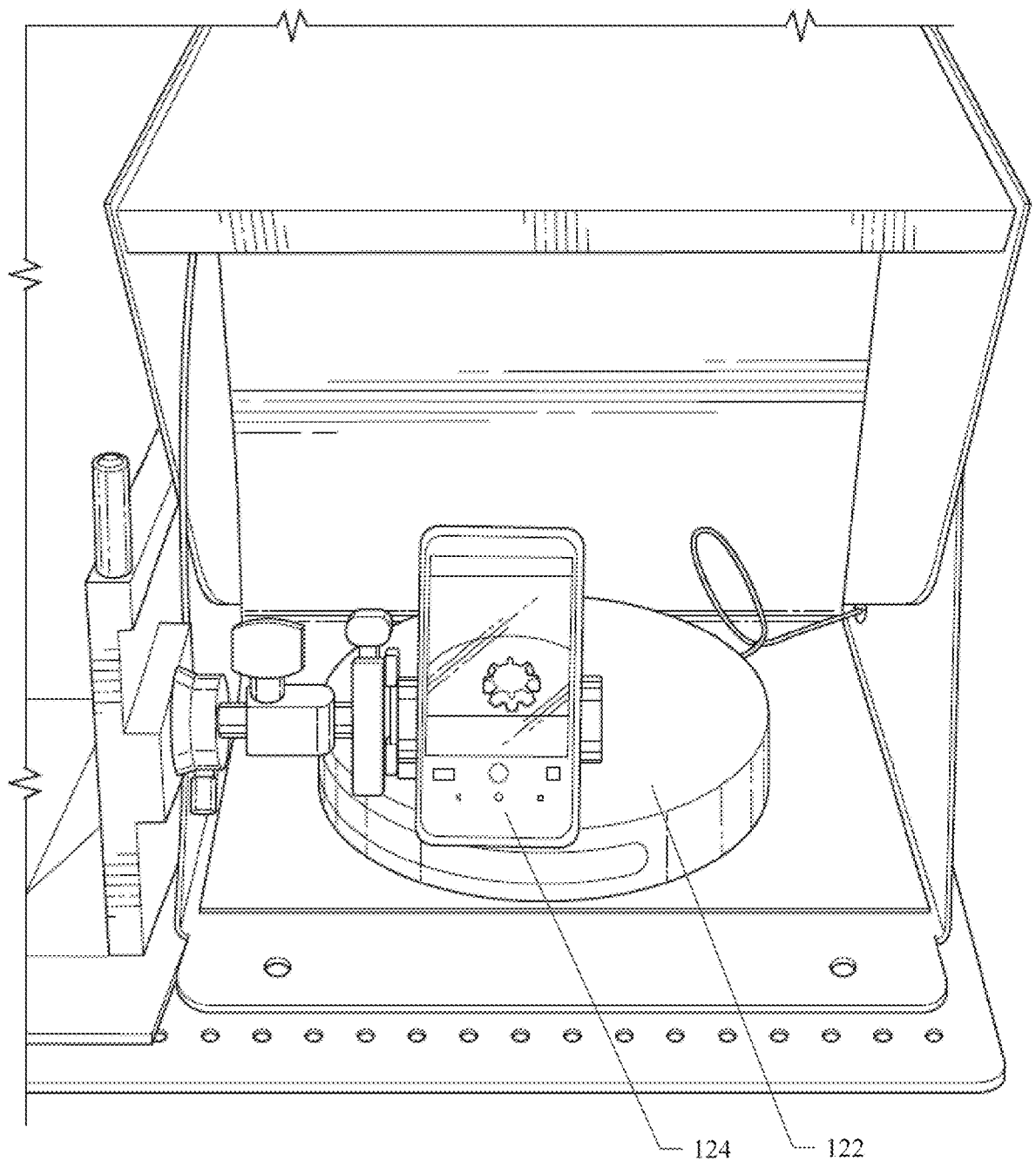

Referring again to FIG. 1, the mobile imaging system 200 can be in network communication with one or a plurality of metrology and analysis studio platforms 120. The metrology and analysis studio platforms 120 can include user platform computing and/or communication and imaging devices, studio structures, lighting, and other resources with which parts or objects to be measured or analyzed are located. In an example embodiment, the metrology and analysis studio platforms 120 can include studio structures in which a part/object to be measured or analyzed is placed and secured with a retention device. The studio structure enables the automated capture of images or photos of the part/object in a consistent and systematic manner. FIGS. 2 through 4 illustrate example embodiments of the metrology and analysis studio platforms 120. In a particular embodiment, the studio structure of the metrology and analysis studio platforms 120 can include a turntable 122 that rotates at intervals and degrees as controlled by the computing and/or communication and imaging device 124, such as a camera phone with an installed software application (app). As described in more detail below, the software application on the computing and/or communication and imaging device 124 can be the downloaded mobile imaging system 200, or a portion thereof. In an example embodiment, the metrology and analysis studio platforms 120 can further include a set of computer-controllable lights that shine on the part/object being measured or analyzed. The mobile imaging system 200 can be configured to control the set of lights of the studio platform 120 to automatically turn on/off each light and automatically capture a photo or image of the part/object with the computing and/or communication and imaging device 124. In this manner, a set of images of the part/object from different angles and with different lighting conditions can be generated. This set of images of the part/object being measured or analyzed can be processed by the mobile imaging system 200 as described in more detail below.

In other example embodiments, the mobile imaging system provides a system to automatically image a part/object to be analyzed or guide the user with the part/object to be analyzed and to automatically take photos or images of the part/object. In one example embodiment, the mobile imaging system provides a stencil based guidance system to guide the user with a part/object to be analyzed and to automatically take photos or images of the part/object after matching a stencil with the part/object. In other embodiments, the mobile imaging system can acquire multiple images of the object or objects, some of which may also contain one or more calibration bars. The object(s) may be imaged in a special enclosure or in an environment with a background of a specific color (e.g., the metrology and analysis studio platform 120). Alternatively, the object(s) may be imaged in their natural environments at a site other than a studio. Even in the natural environment, the mobile device with the camera (e.g., a drone with camera) can be in data communication with the network. Irrespective of whether images are obtained using the same camera or multiple cameras, the images are processed in a similar way. In one embodiment, images of the object or objects, which may or may not have special markers attached to them, can be captured in different poses using a single camera or multiple cameras by rotating or translating the object on a moving platform, such as a manual or automatic turntable 122, a drone, a robot, a robotic-arm, or by manually moving the camera and capturing images from different camera locations. In the example embodiments, the mobile imaging system can analyze the images of the object for focus, lighting, and contrast, and apply an object bounding box around the object. The images can be uploaded to a server 110 in a network cloud 115. The server 110, and the mobile imaging system 200 therein, can generate a three dimensional (3D) model of the object from the images of the object. The server 110 can generate measurements of the edges and surfaces or other metrology results of the object from the 3D model and/or the object images. The server 110 can also generate information related to object point scans, object reverse engineering data, object assembly guidance, and object analysis. The metrology results and other output related to the object as generated by the mobile imaging system 200 of the various example embodiments can be provided to a user via a mobile device, email, web browser, or other presentation platform as described in more detail below.

In various example embodiments, one or more of the metrology and analysis studio platforms 120 can be provided by one or more third party providers operating at various locations in a network ecosystem. It will be apparent to those of ordinary skill in the art that metrology and analysis studio platforms 120 can include or be any of a variety of networked third party service providers as described in more detail below. In a particular embodiment, a resource list maintained at the host site 110 can be used as a summary or list of all metrology and analysis studio platforms 120, which users or the host site 110 may visit/access and from which users or the host site 110 can obtain part/object metrology or analysis information. The host site 110, metrology and analysis studio platforms 120, and user platforms 140 may communicate and transfer data and information in the data network ecosystem shown in FIG. 1 via a wide area data network (e.g., the Internet) 115. Various components of the host site 110 can also communicate internally via a conventional intranet or local area network (LAN) 114.

Networks 115 and 114 are configured to couple one computing device with another computing device. Networks 115 and 114 may be enabled to employ any form of computer readable media for communicating information from one electronic device to another. Network 115 can include the Internet in addition to LAN 114, wide area networks (WANs), direct connections, such as through a universal serial bus (USB) port, other forms of computer-readable media, or any combination thereof. On an interconnected set of LANs, including those based on differing architectures and protocols, a router and/or gateway device acts as a link between LANs, enabling messages to be sent between computing devices. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communication links known to those of ordinary skill in the art. Furthermore, remote computers and other related electronic devices can be remotely connected to either LANs or WANs via a wireless link, WiFi, Bluetooth™, satellite, or modem and temporary telephone link.

Networks 115 and 114 may further include any of a variety of wireless sub-networks that may further overlay stand-alone ad-hoc networks, and the like, to provide an infrastructure-oriented connection. Such sub-networks may include mesh networks, Wireless LAN (WLAN) networks, cellular networks, and the like. Networks 115 and 114 may also include an autonomous system of terminals, gateways, routers, and the like connected by wireless radio links or wireless transceivers. These connectors may be configured to move freely and randomly and organize themselves arbitrarily, such that the topology of networks 115 and 114 may change rapidly and arbitrarily.

Networks 115 and 114 may further employ a plurality of access technologies including 2nd (2G), 2.5, 3rd (3G), 4th (4G) generation radio access for cellular systems, WLAN, Wireless Router (WR) mesh, and the like. Access technologies such as 2G, 3G, 4G, and future access networks may enable wide area coverage for mobile devices, such as one or more of client devices 141, with various degrees of mobility. For example, networks 115 and 114 may enable a radio connection through a radio network access such as Global System for Mobile communication (GSM), General Packet Radio Services (GPRS), Enhanced Data GSM Environment (EDGE), Wideband Code Division Multiple Access (WCDMA), CDMA2000, and the like. Networks 115 and 114 may also be constructed for use with various other wired and wireless communication protocols, including TCP/IP, UDP, SIP, SMS, RTP, WAP, CDMA, TDMA, EDGE, UMTS, GPRS, GSM, UWB, WiFi, WiMax, IEEE 802.11x, and the like. In essence, networks 115 and 114 may include virtually any wired and/or wireless communication mechanisms by which information may travel between one computing device and another computing device, network, and the like. In one embodiment, network 114 may represent a LAN that is configured behind a firewall (not shown), within a business data center, for example.

The metrology and analysis studio platforms 120 and/or the user platforms 140 may include any of a variety of providers or consumers of network transportable digital data. The network transportable digital data can be transported in any of a family of file formats, protocols, and associated mechanisms usable to enable a host site 110 and a user platform 140 to send or receive images of parts/objects and related analysis information over the network 115. In example embodiments, the file format can be a Joint Photographic Experts Group (JPEG) file, a Portable Document Format (PDF), a Microsoft™ Word document or Excel spreadsheet format, a CSV (Comma Separated Values) format; however, the various embodiments are not so limited, and other file formats and transport protocols may be used. For example, other data formats or formats other than open/standard formats can be supported by various embodiments. Any electronic file format, such as Microsoft™ Access Database Format (MDB), audio (e.g., Motion Picture Experts Group Audio Layer 3—MP3, and the like), video (e.g., MP4, and the like), and any proprietary interchange format defined by specific sites can be supported by the various embodiments described herein. Moreover, a metrology and analysis studio platform 120 and/or user platform 140 may provide a variety of different data sets or computational modules.

In a particular embodiment, a user platform 140 with one or more client devices enables a user to generate data or access data provided by the mobile imaging system 200 via the host 110 and network 115. Client devices of user platform 140 may include virtually any computing device that is configured to send and receive information over a network, such as network 115. Such client devices may include portable devices 144, such as, cellular or satellite telephones, smartphones, imaging devices, radio frequency (RF) devices, infrared (IR) devices, global positioning devices (GPS), Personal Digital Assistants (PDAs), handheld computers, wearable computers, tablet computers, integrated devices combining one or more of the preceding devices, and the like. The client devices may also include other computing devices, such as personal computers 142, multiprocessor systems, microprocessor-based or programmable consumer electronics, network PC's, and the like. The client devices may also include other processing devices, such as consumer electronic (CE) devices 146 and/or mobile computing devices 148, which are known to those of ordinary skill in the art. As such, the client devices of user platform 140 may range widely in terms of capabilities and features. In most cases, the client devices of user platform 140 will include an image capturing device, such as a camera. Moreover, the web-enabled client device may include a browser application enabled to receive and to send wireless application protocol messages (WAP), and/or wired application messages, and the like. In one embodiment, the browser application is enabled to employ HyperText Markup Language (HTML), Dynamic HTML, Handheld Device Markup Language (HDML), Wireless Markup Language (WML), WMLScript, JavaScript™, EXtensible HTML (xHTML), Compact HTML (CHTML), and the like, to display and/or send digital information. In other embodiments, mobile devices can be configured with applications (apps) with which the functionality described herein can be implemented.

The client devices of user platform 140 may also include at least one client application that is configured to capture or receive image data, analysis data, and/or control data from another computing device via a wired or wireless network transmission. The client application may include a capability to provide and receive textual data, image data, graphical data, video data, audio data, and the like. Moreover, client devices of user platform 140 may be further configured to communicate and/or receive a message, such as through a Short Message Service (SMS), direct messaging (e.g., Twitter™), email, Multimedia Message Service (MMS), instant messaging (IM), internet relay chat (IRC), mIRC, Jabber, Enhanced Messaging Service (EMS), text messaging, Smart Messaging, Over the Air (OTA) messaging, or the like, between another computing device, and the like.

Referring again to FIG. 1, the mobile imaging system 200 of an example embodiment is shown to include a mobile imaging system database 112. The database 112 can be used to retain a variety of information data sets including, but not limited to, parts/object information, parts or objects listing information, image data, parts/object analytics, control data and the like. It will be apparent to those of ordinary skill in the art that the mobile imaging system database 112 can be locally resident at the host site 110, remotely located at other server locations, stored in network cloud storage, or stored in whole or in part on a client device of user platform 140.

Referring again to FIG. 1, host site 110 of an example embodiment is shown to include the mobile imaging system 200. In an example embodiment, mobile imaging system 200 can include an object metrology processing module 210. Each of these modules can be implemented as software components executing within an executable environment of mobile imaging system 200 operating on host site 110 or user platform 140. Each of these modules of an example embodiment is described in more detail below in connection with the figures provided herein.

Referring still to FIG. 1, the mobile imaging system 200 can include an object metrology processing module 210. The object metrology processing module 210 can be configured to perform the processing as described herein. In a particular example embodiment, the object metrology processing module 210 can be configured to provide a system to automatically image a part/object to be analyzed or guide the user with the part/object to be analyzed and to automatically take photos or images of the part/object. In one example embodiment, the object metrology processing module 210 can provide a stencil based guidance system to guide the user with a part/object to be analyzed and to automatically take photos or images of the part/object after matching a stencil with the part/object. In other embodiments, the object metrology processing module 210 can acquire multiple images of the object or objects, some of which may also contain one or more calibration bars. The object(s) may be imaged in a special enclosure or in an environment with a background of a specific color (e.g., the metrology and analysis studio platform 120). Alternatively, the object(s) may be imaged in their natural environments at a site other than a studio. Even in the natural environment, the mobile device with the camera can be in data communication with the network. Irrespective of whether images are obtained using the same camera or multiple cameras, the images are processed in a similar way. In one embodiment, images of the object or objects, which may or may not have special markers attached to them, can be captured in different poses using a single camera or multiple cameras by rotating or translating the object on a moving platform, such as a manual or automatic turntable, a drone, a robot, a robotic-arm, or by manually moving the camera and capturing images from different camera locations. In the example embodiments, the object metrology processing module 210 can analyze the images of the object for focus, lighting, and contrast, and apply an object bounding box around the object. The images can be uploaded to a server in a network cloud and processed by the object metrology processing module 210 hosted on the server. Alternatively, the object metrology processing module 210 can be downloaded and executed locally on a mobile device of user platform 140. In either case, the object metrology processing module 210 can generate a three dimensional (3D) model of the object from the images of the object. The object metrology processing module 210 can generate measurements of the edges and surfaces or other metrology results of the object from the 3D model and/or the object images. The object metrology processing module 210 can also generate information related to object point scans, object reverse engineering data, object assembly guidance, and object analysis. The metrology results and other output related to the object as generated by object metrology processing module 210 of the various example embodiments can be provided to a user via a mobile device, email, web browser, or other presentation platform of user platform 140.

Figure 5:
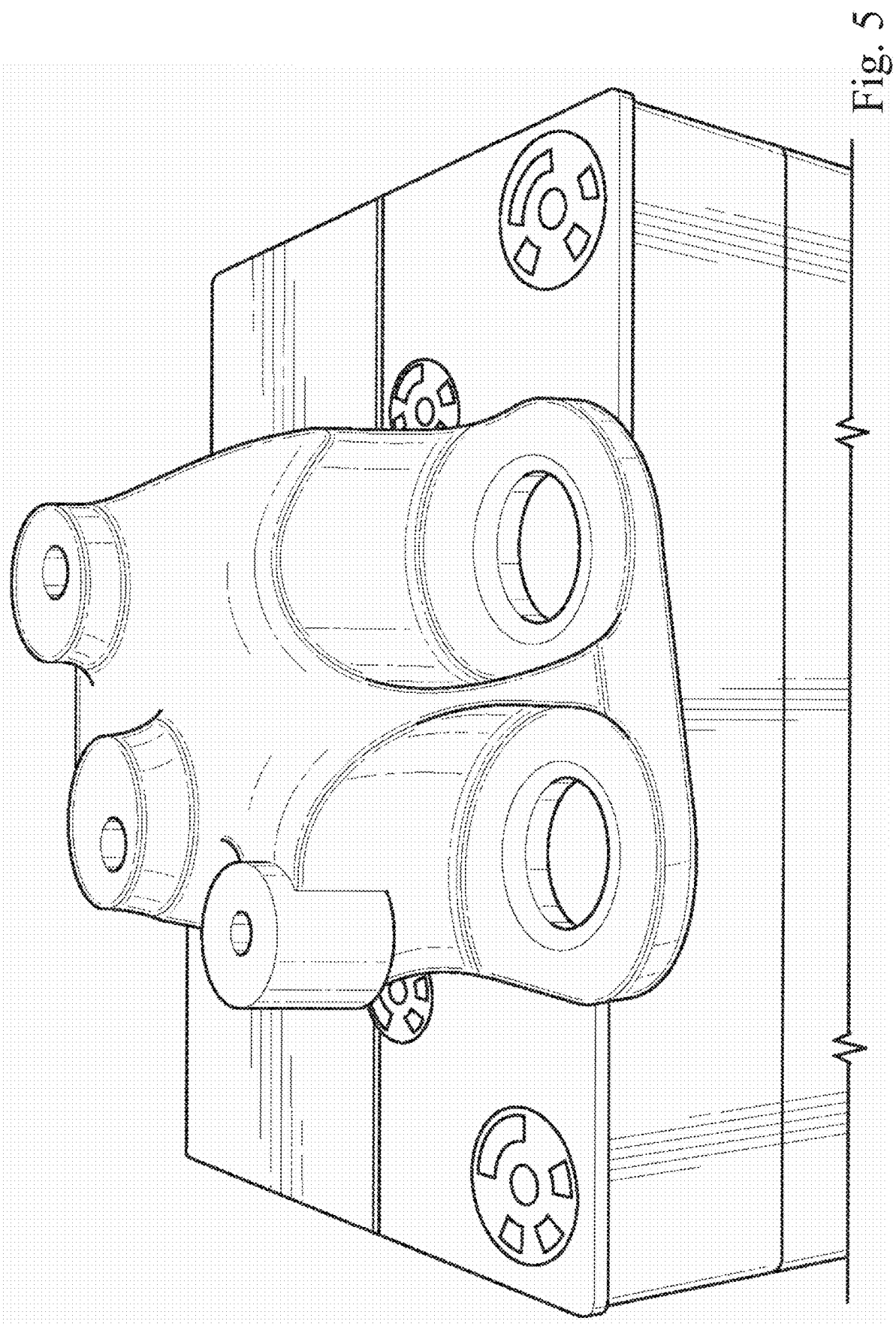
FIGS. 5 and 6 illustrate an example embodiment wherein a sample object and a calibration bar are placed on a turntable, which is rotated to different positions as images are acquired.
Figure 6:
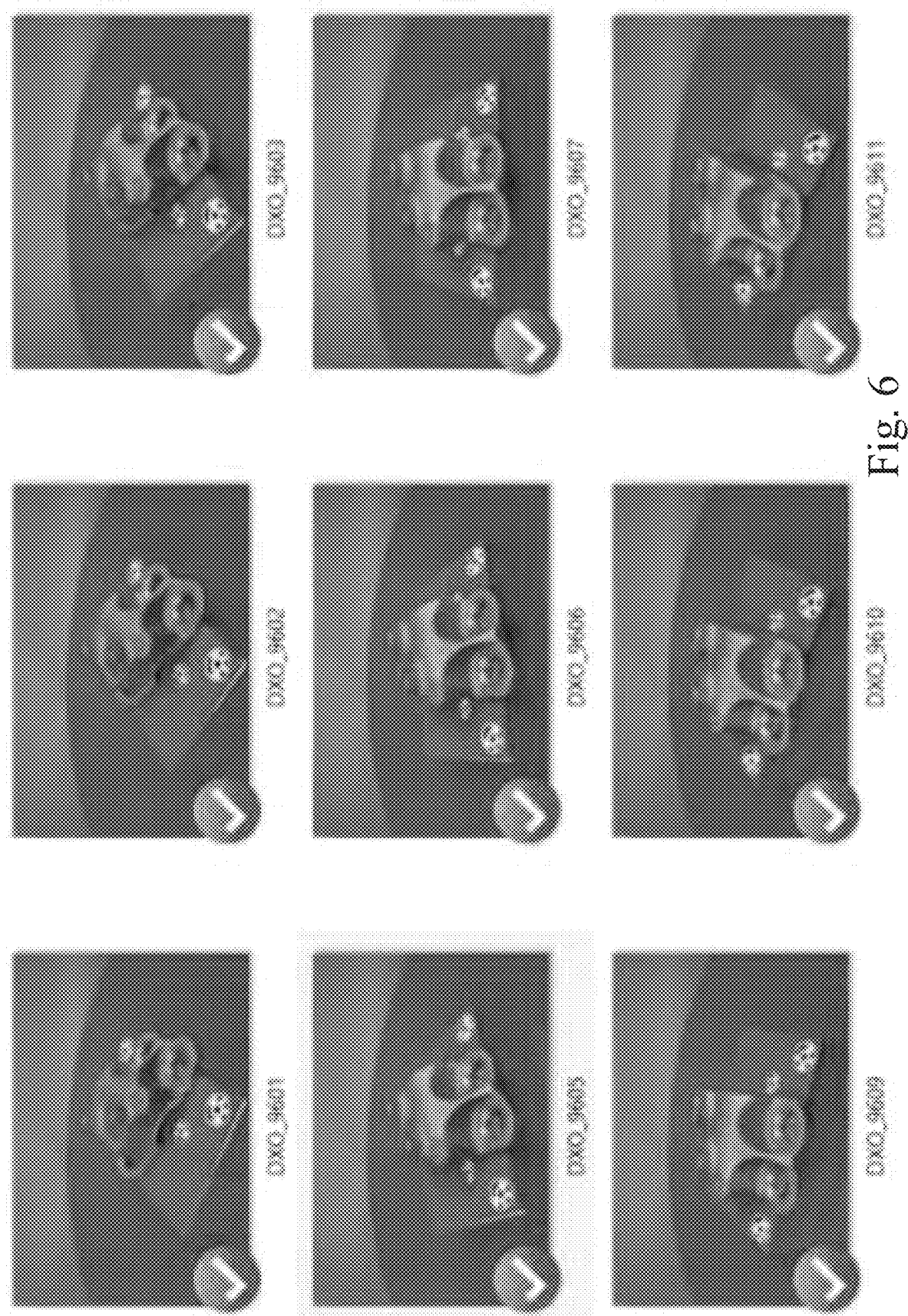

FIGS. 5 and 6 illustrate an example embodiment wherein a sample object and a calibration bar are placed on a turntable, which can be rotated to different positions as images are acquired. FIG. 5 illustrates the object to be imaged as placed on a spacer, which is positioned in or on the turntable. The object can also be placed adjacent to a calibration bar, which can include one or more calibration symbols or other photogrammetric markers (e.g., ArUco markers) to assist in the metrology of the object. ArUco is a well-known OpenSource library for camera pose estimation using squared markers. ArUco markers are small two-dimensional (2D) barcodes. Each ArUco marker corresponds to a number, encoded into a small grid of black and white pixels. The ArUco decoding algorithm is capable of locating, decoding, and of estimating the pose (location and orientation in space) of any ArUco markers in the camera's field of view.

The image icons illustrated in FIG. 6 show different images of the object on the rotating turntable as taken at different turntable positions. All non-essential elements are colored in a distinctive color (e.g., red) so that they can be masked out and the object can be isolated during reconstruction or analysis. The set of images as shown in FIG. 6 can be used by the object metrology processing module 210 to generate a three dimensional (3D) model of the object from the images of the object. The object metrology processing module 210 can also generate measurements of the edges and surfaces or other metrology results of the object from the 3D model and/or the object images. The object metrology processing module 210 can also generate information related to object point scans, object reverse engineering data, object assembly guidance, and object analysis from the object images.

Figure 7:
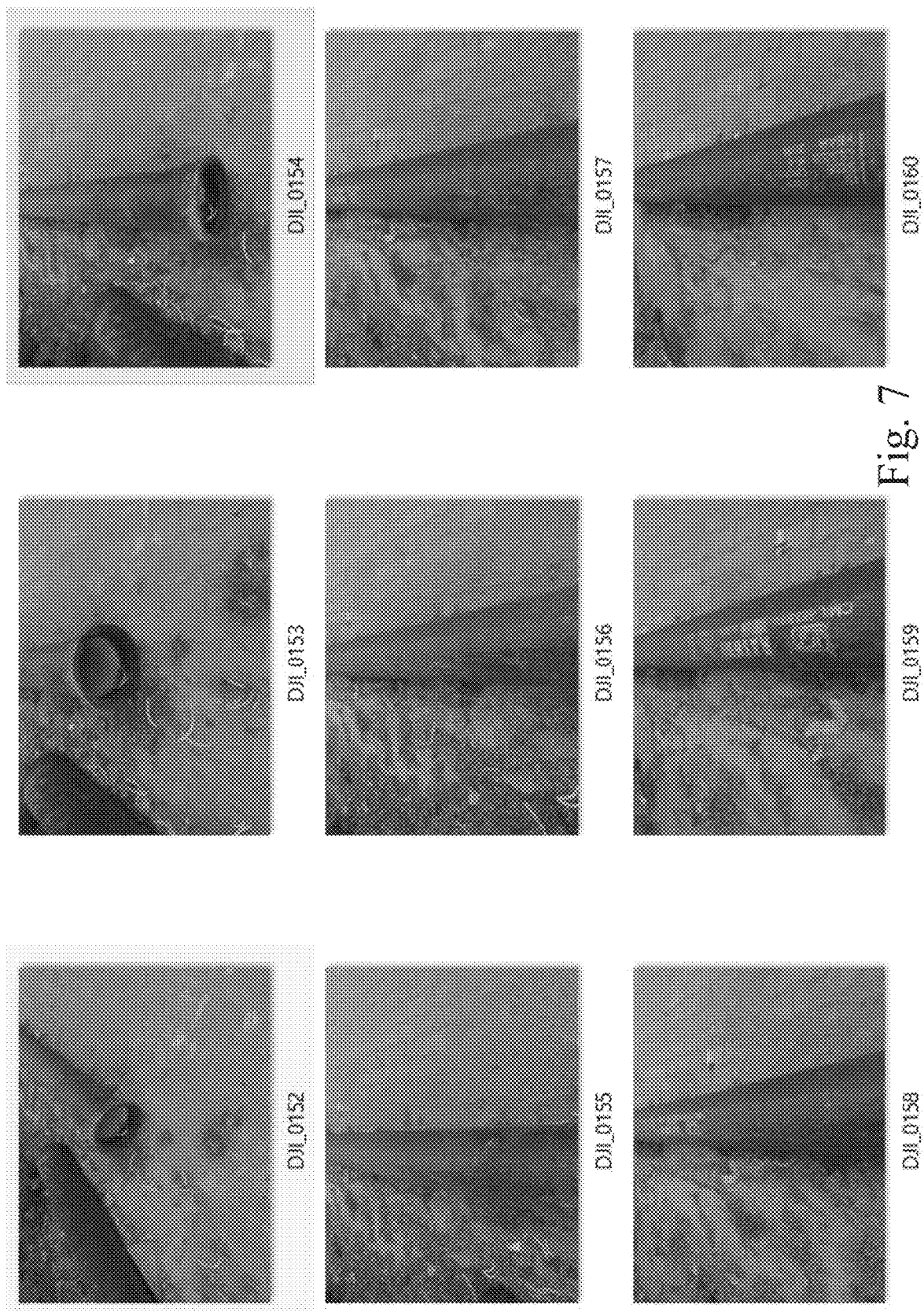
FIG. 7 illustrates an example embodiment wherein a sample object is imaged in its natural location with a drone from above.

FIG. 7 illustrates an example embodiment wherein a sample object (e.g., a pipe) is imaged in its natural location with a drone and camera from above. Alternatively, the object being analyzed can be imaged in its natural location with handheld cameras, mobile device cameras, robotic cameras, or other image capturing devices. In a similar manner as described above, the set of images of the object, such as the set of object images shown in FIG. 7, can be captured and used by the object metrology processing module 210 to generate a 3D model of the object from the images of the object. The object metrology processing module 210 can also generate measurements of the edges and surfaces or other metrology results of the object from the 3D model and/or the object images. The object metrology processing module 210 can also generate information related to object point scans, object reverse engineering data, object assembly guidance, and object analysis from the object images.

Figure 8:
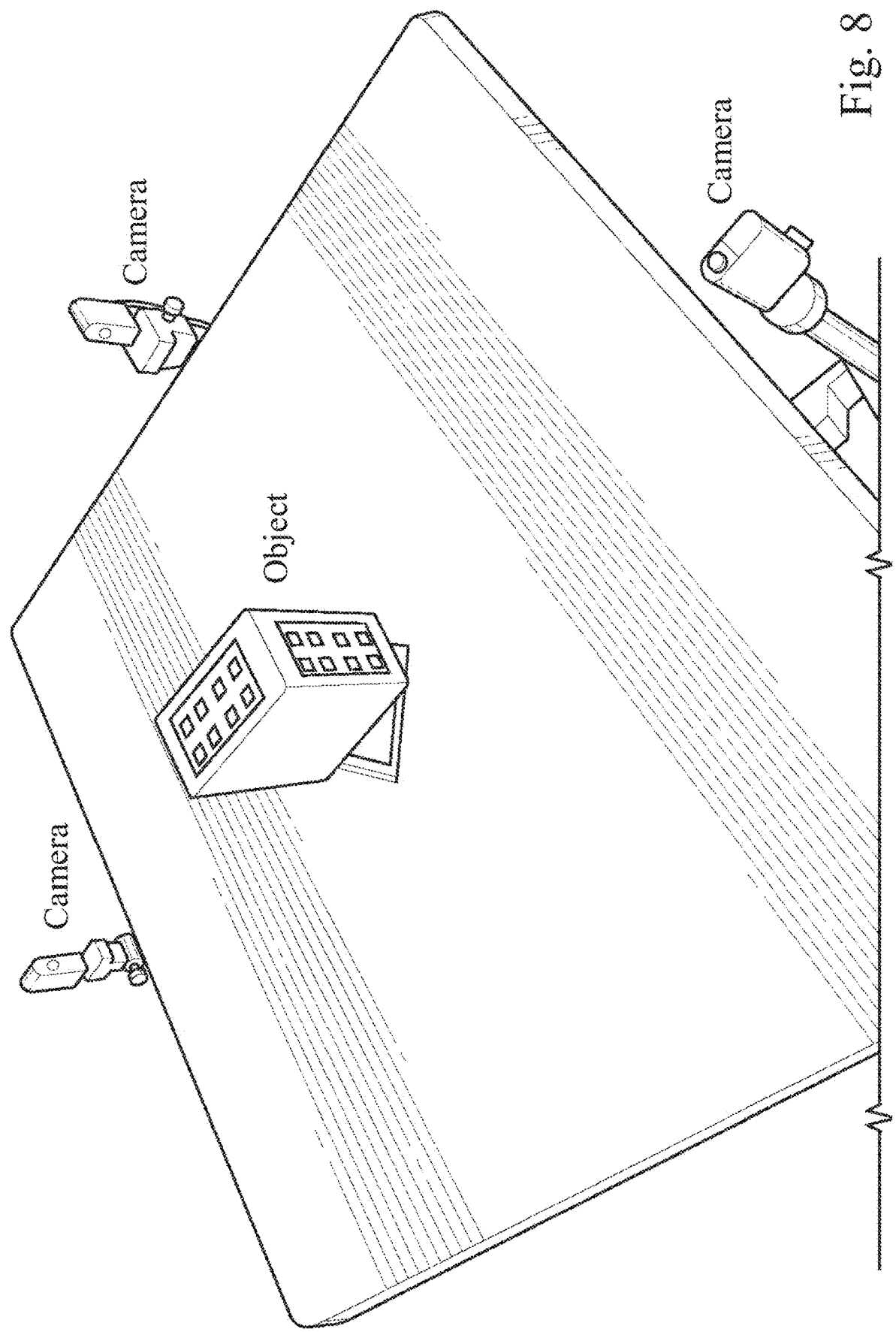
FIG. 8 illustrates an example embodiment of the metrology and analysis studio platform wherein multiple cameras on tripods can image an object, in this case, the object has ArUco markers optionally placed on the object.

FIG. 8 illustrates an example embodiment of the metrology and analysis studio platform wherein multiple cameras on tripods or support rigs can image an object. In the example shown, the object has ArUco markers optionally placed on the object to assist in the metrology of the object. The multiple cameras can be positioned on or adjacent to the platform at various locations around the object. The images from the multiple cameras can be captured and wirelessly transferred to server 110 or the user platform 140 on which the object metrology processing module 210 can be executed. In a similar manner as described above, the set of images obtained from the multiple cameras can be used by the object metrology processing module 210 to generate a 3D model of the object from the images of the object. The object metrology processing module 210 can also generate measurements of the edges and surfaces or other metrology results of the object from the 3D model and/or the object images. The object metrology processing module 210 can also generate information related to object point scans, object reverse engineering data, object assembly guidance, and object analysis from the object images.

Figure 9:
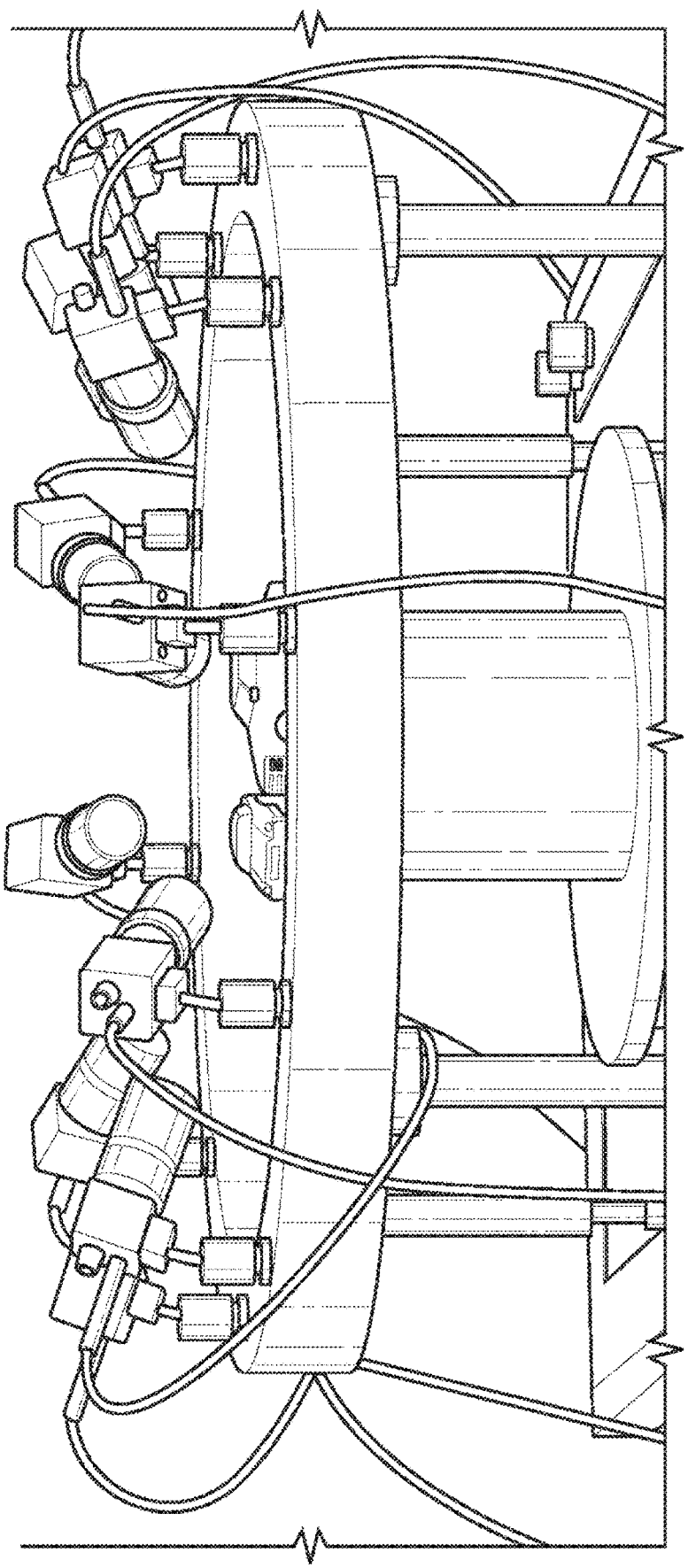
FIG. 9 illustrates an example embodiment of the metrology and analysis studio platform wherein multiple cameras on a customized rig can image an object.

FIG. 9 illustrates an example embodiment of the metrology and analysis studio platform wherein multiple cameras on a customized rig can be used to image an object. The multiple cameras can be positioned on the customized rig at various locations around the object. The images from the multiple cameras can be captured and wirelessly transferred to server 110 or the user platform 140 on which the object metrology processing module 210 can be executed. In a similar manner as described above, the set of images obtained from the multiple cameras can be used by the object metrology processing module 210 to generate a 3D model of the object from the images of the object. The object metrology processing module 210 can also generate measurements of the edges and surfaces or other metrology results of the object from the 3D model and/or the object images. The object metrology processing module 210 can also generate information related to object point scans, object reverse engineering data, object assembly guidance, and object analysis from the object images.

Irrespective of how the images of the object are acquired, the acquired images can be uploaded to the server 110. Alternatively, the object images can be saved to a suitable device (e.g. a smartphone, desktop or laptop computer, workstation, server, etc.) and later uploaded to the server 110. In other embodiments, the object images may be processed locally on a mobile device, desktop or laptop computer, workstation, or other device on a user platform 140. In a different embodiment, the entire process of acquiring images with automatic rotation of the turntable, uploading to a server or sending to a local computer, displaying progress and final results may be controlled through an app on a mobile device, such as a smartphone, tablet, or the like.

Figure 10:
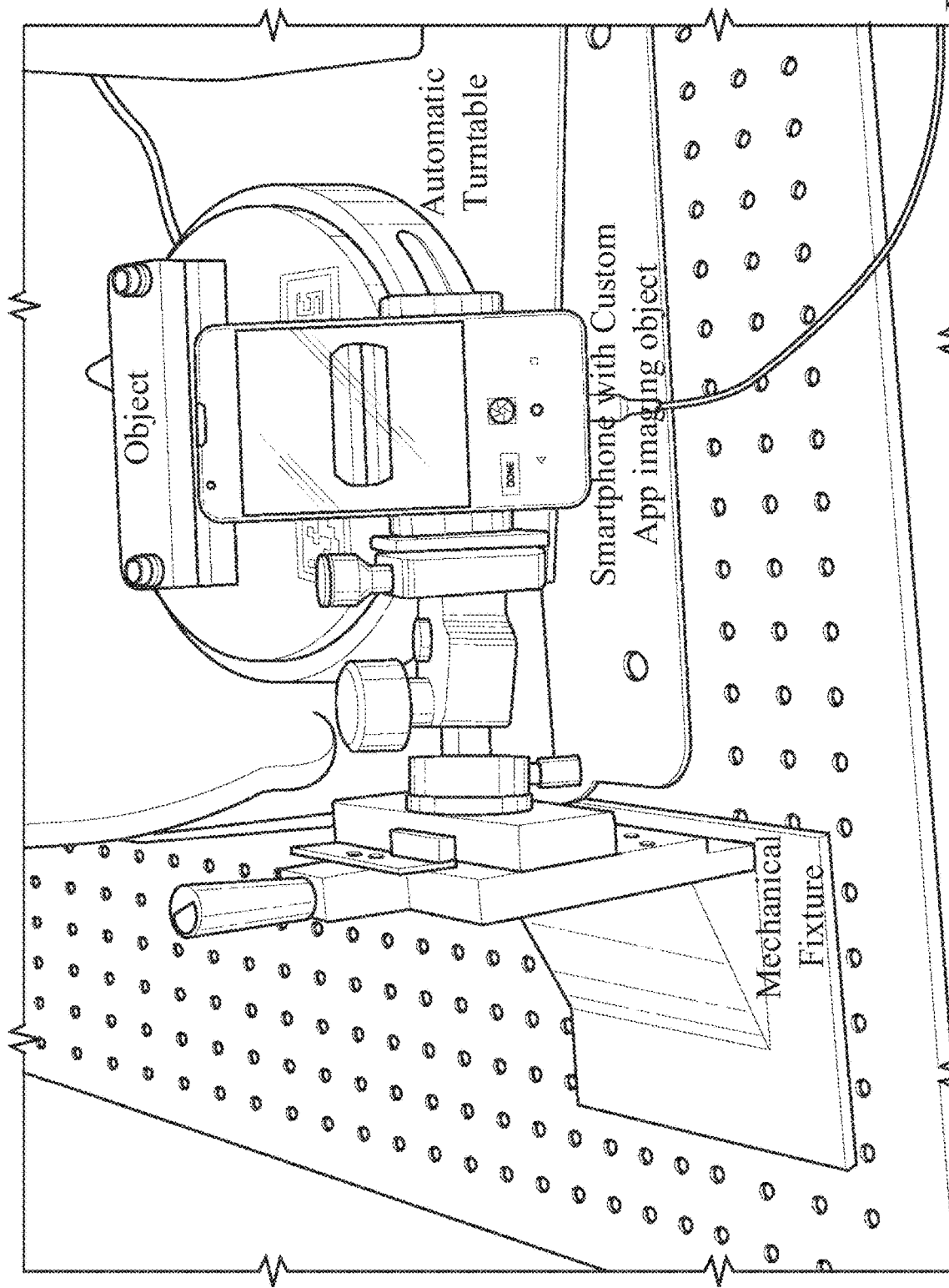
FIG. 10 illustrates an example embodiment of the metrology and analysis studio platform wherein an object can be placed on an automated turntable with a marker bar (seen in the smartphone screen) for automatic image acquisition.

FIG. 10 illustrates an example embodiment of the metrology and analysis studio platform wherein an object can be placed in or on an automated turntable with a marker bar (seen in the smartphone screen) for automatic image acquisition. In the example shown, an object is positioned on an automatic turntable adjacent to a mobile device (e.g., a smartphone) on which an instance of the object metrology processing module 210 can be executed as a mobile device app. The mobile device can be positioned and retained using a mechanical fixture or rig. The position and angle of the mobile device relative to the object being imaged can be precisely controlled with the mechanical fixture or rig. In the example embodiment shown, the mobile device app can send a wireless command to the automatic turntable through a Bluetooth™ or WiFi data transmission. The wireless command can cause the automatic turntable to move in a precisely controlled manner and amount to position the automatic turntable and the object thereon in a precise location or position. The mobile device app can then cause the camera of the mobile device to acquire an image of the object after the automatic turntable finishes a rotation or movement. The process can be repeated for multiple positions and images of the object. Once all angles of the object are covered, the mobile device app can upload the automatically acquired images of the object to the server 110 for processing. In a similar manner as described above, the set of images obtained from the mobile device app can be used by the object metrology processing module 210 to generate a 3D model of the object from the images of the object. The object metrology processing module 210 can also generate measurements of the edges and surfaces or other metrology results of the object from the 3D model and/or the object images. The object metrology processing module 210 can also generate information related to object point scans, object reverse engineering data, object assembly guidance, and object analysis from the object images. Once the server 110 completes the processing of the object images, the server 110 can send the processed data to the mobile device.

In the example embodiment shown in FIG. 10, the mechanical fixture or rig can be augmented or replicated to install multiple imaging mobile devices around the automatic turntable. The mobile device app may also perform checks on each image to ensure that various quality metrics (e.g. focus, speckle quality, etc.) are met and prompt the user to intervene if images are consistently poor. The mobile device app may also perform a preliminary (albeit low-quality) reconstruction of the object images on the mobile device and display the results to the user in successive partial reconstructions as more and more images of the object are acquired. Additionally, the mobile device app may assist the user in placing and orienting the object(s) correctly with respect to the camera(s) so that an accurate 3D reconstruction of the object can be obtained. An example of this assisted placement with part-based stencils is shown in FIG. 11 and described below.

FIG. 11 illustrates an example embodiment wherein part-based stencils 510 can be used to guide the user to properly align the object and calibration bar relative to the camera(s) being used to image the object. On the left portion of FIG. 11, the part/object being imaged is displayed with a stencil 510 depicting an improper placement of the object for imaging. In this sample case, the part/object is misaligned relative to the stencil 510. Thus, the user is prompted to move the object to align the stencil 510 with the object. On the right portion of FIG. 11, after being prompted the user has used the stencil 510 to correct (align) the position of the part/object being imaged and the marker bar relative to the stencil 510. In this manner, the example embodiment can provide assisted object placement with part-based stencils.

Figure 12:
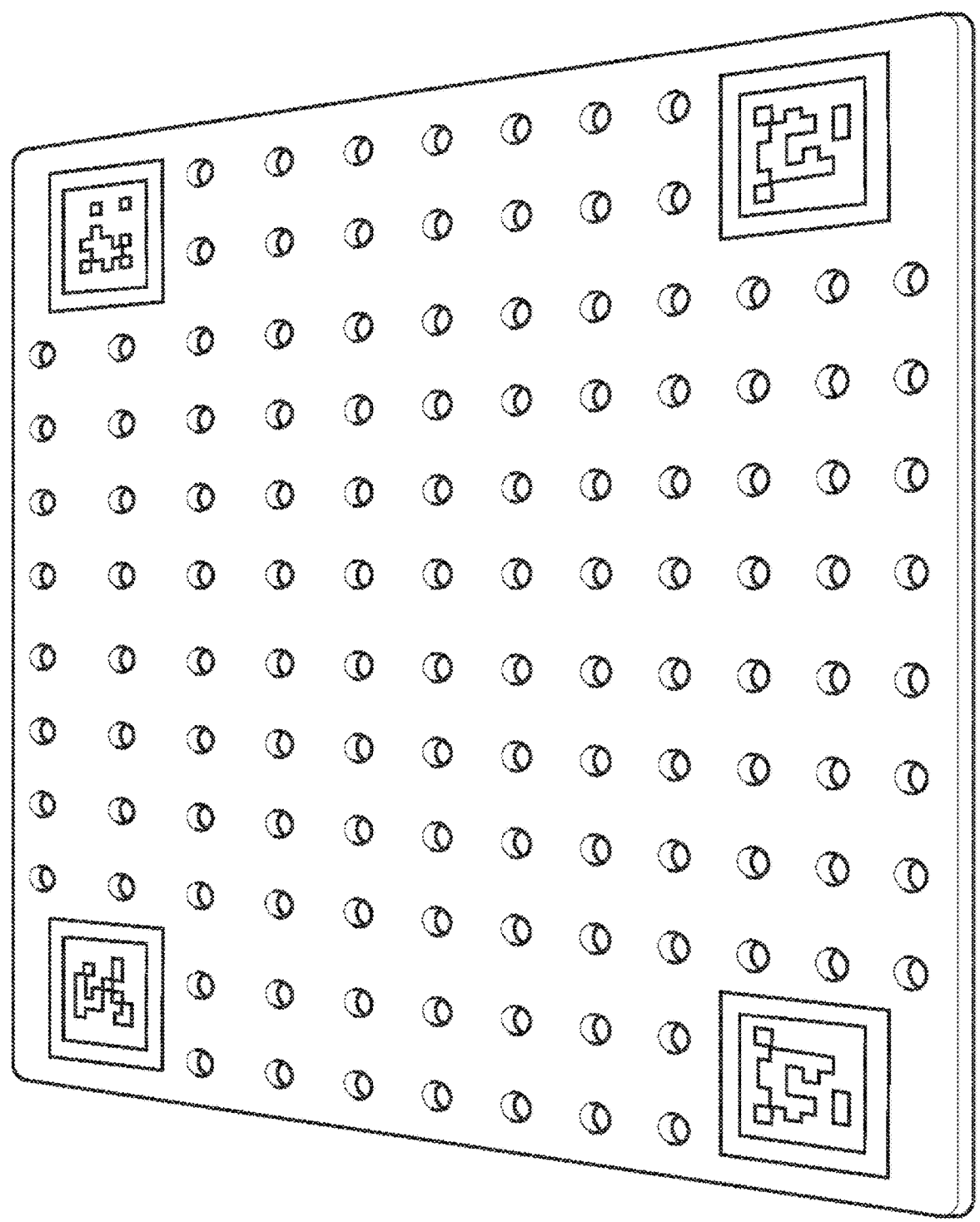
FIG. 12 illustrates an example embodiment wherein a plate with a grid of threaded holes and etched ArUco markers is provided for positioning and orientation of the part/object being imaged.

FIG. 12 illustrates an example embodiment wherein a plate with a grid of threaded holes and etched ArUco markers is provided for positioning and orientation of the part/object being imaged. In the example embodiment using the grid of tapped holes, the object can be placed in a pre-set position and orientation with respect to the ArUco markers. Then, the position and orientation of the ArUco markers with respect to the camera can be computed by the object metrology processing module 210 executing as a mobile device app. Once the correct position and orientations of the ArUco markers are computed by the mobile device app, the mobile device app can determine the adjustments required for accurate 3D object reconstruction. Thus, the object metrology processing module 210 can compute the adjustments to the camera position and orientation (e.g., pose) required for optimal alignment of the object for imaging. The object metrology processing module 210 executing as a mobile device app can provide visual cues to the user to achieve this best pose of the object to achieve accurate 3D object reconstruction. Once the correct alignment is achieved, the mobile device app can guide the user in acquiring and uploading the images of the object.

Figure 13:
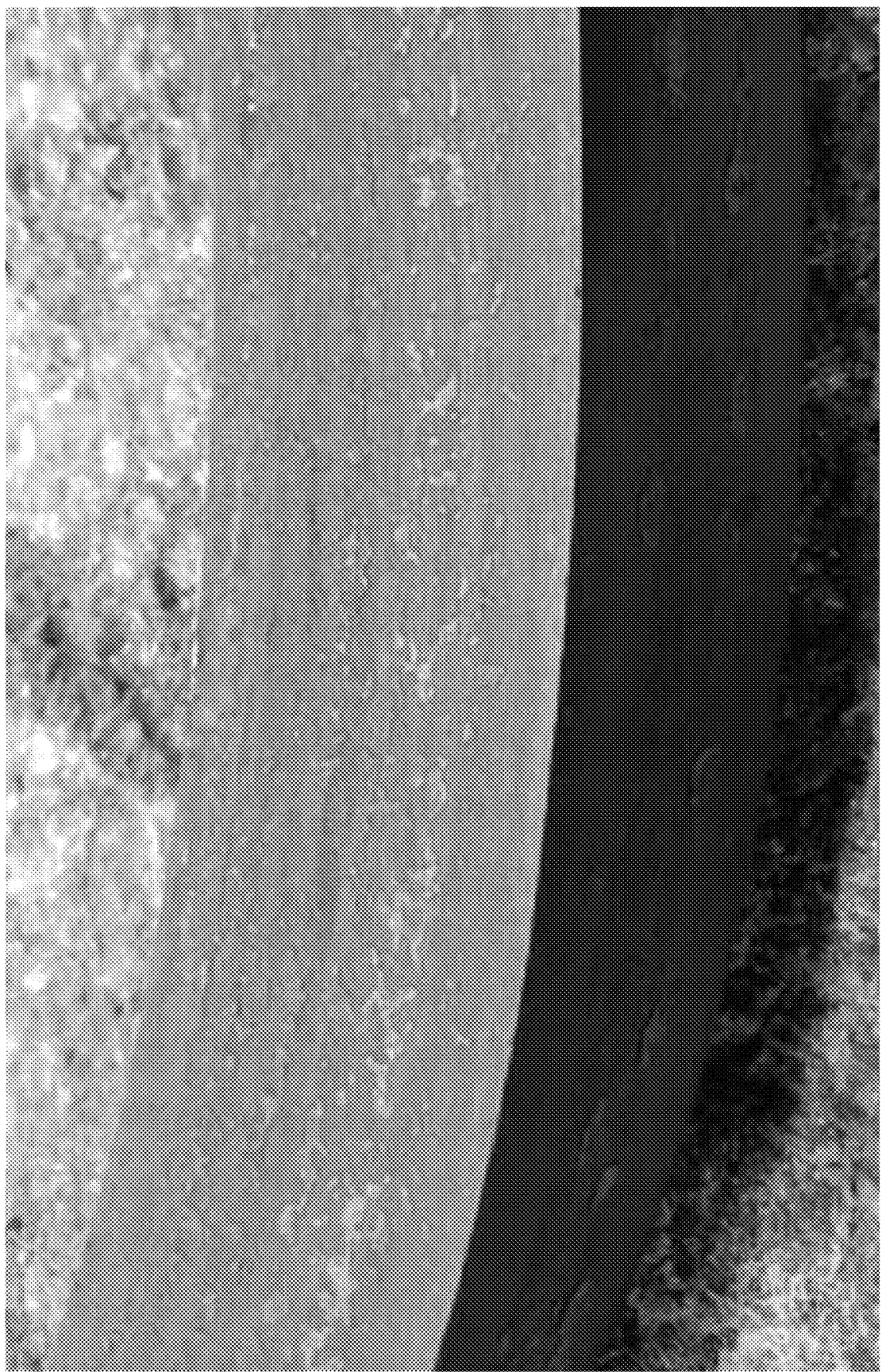
FIGS. 13 through 15 illustrate an example embodiment wherein a sample object can have a natural visual texture or a texture can be applied to the object physically or via projection.
Figure 14:
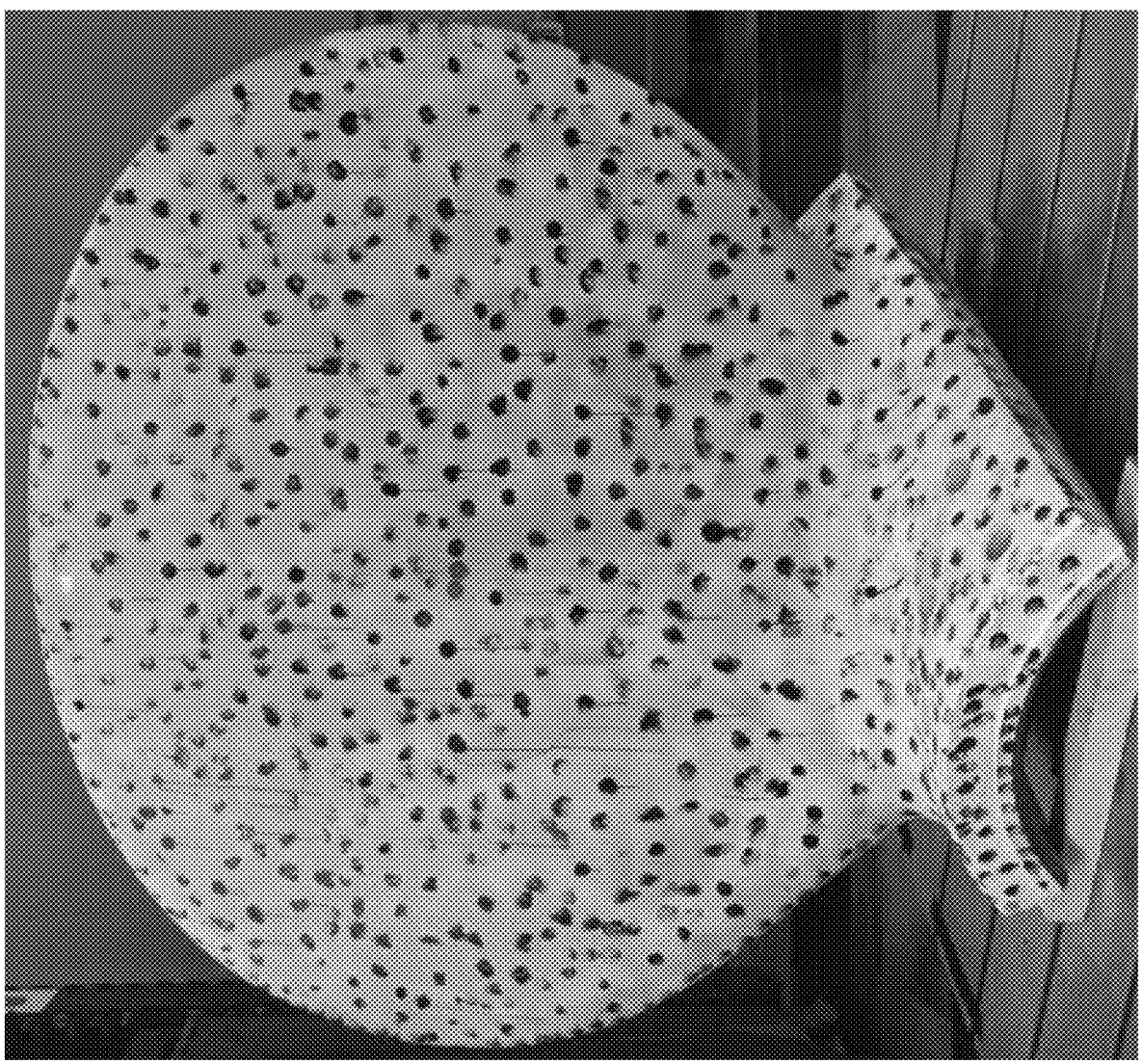
Figure 15:
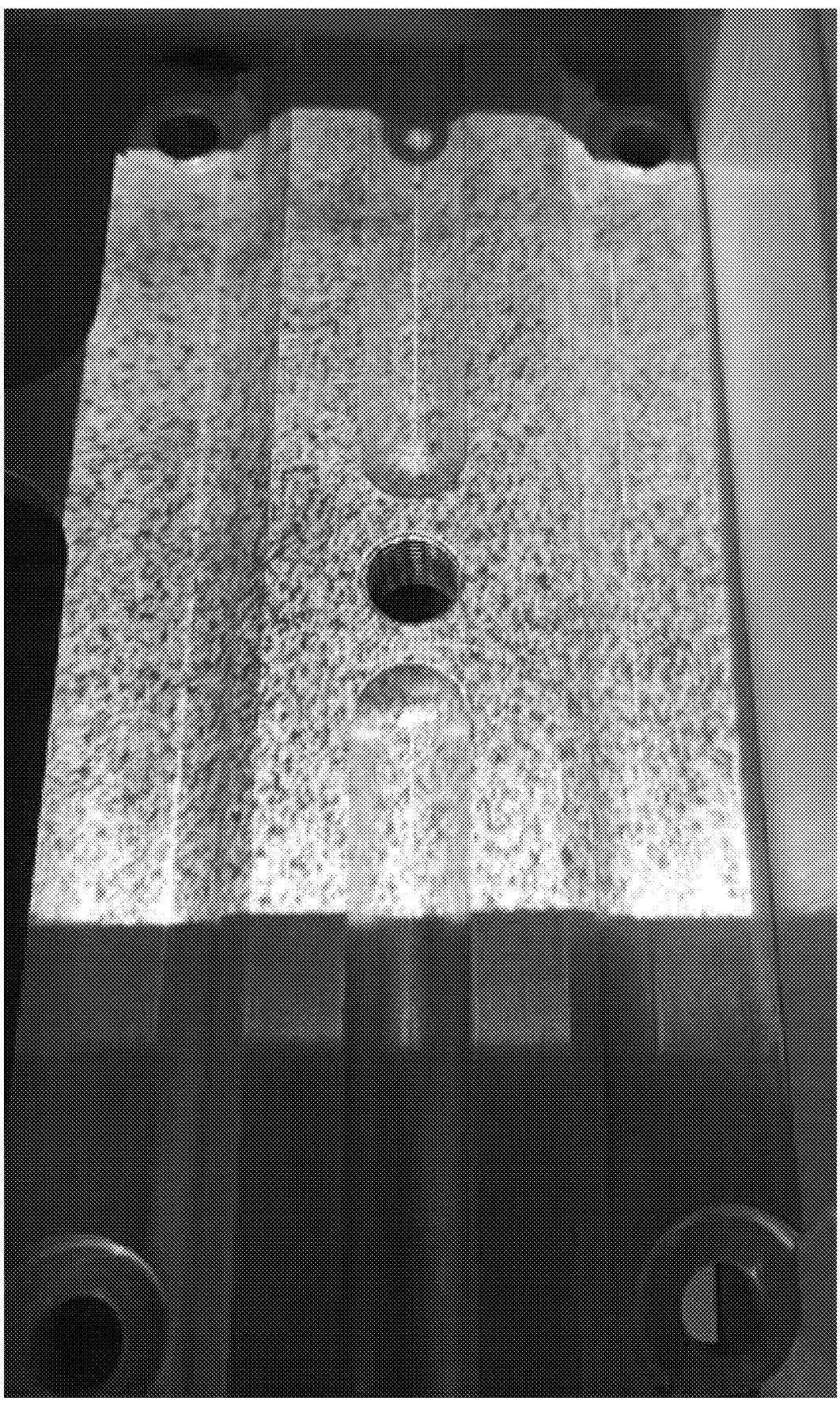

FIGS. 13 through 15 illustrate an example embodiment wherein a sample object can have a natural visual texture or a texture can be applied to the object physically or via projection. In an example embodiment, the process relies on a visual texture on the surface of the parts or objects for accurate 3D reconstruction. As shown in FIG. 13, some objects have a natural texture that can be exploited when the object is imaged. If such a natural texture is available on the object being imaged, the images of the objects may be acquired without any surface preparation. If such natural texture is not available or not visible, a physically applied texture, such as contrasting black and white speckles, may be applied through paints or other means as shown in FIG. 14. Alternatively, if such natural or physically applied texture is not available or not visible, a projection applied texture, such as texture images projected onto the object with an image projection device, may be applied to the object as shown in FIG. 15. In any case, the texture of the object being imaged can be captured in the set of images obtained from the mobile device app and used by the object metrology processing module 210 to generate a 3D model of the object from the images of the object.

Figure 16:
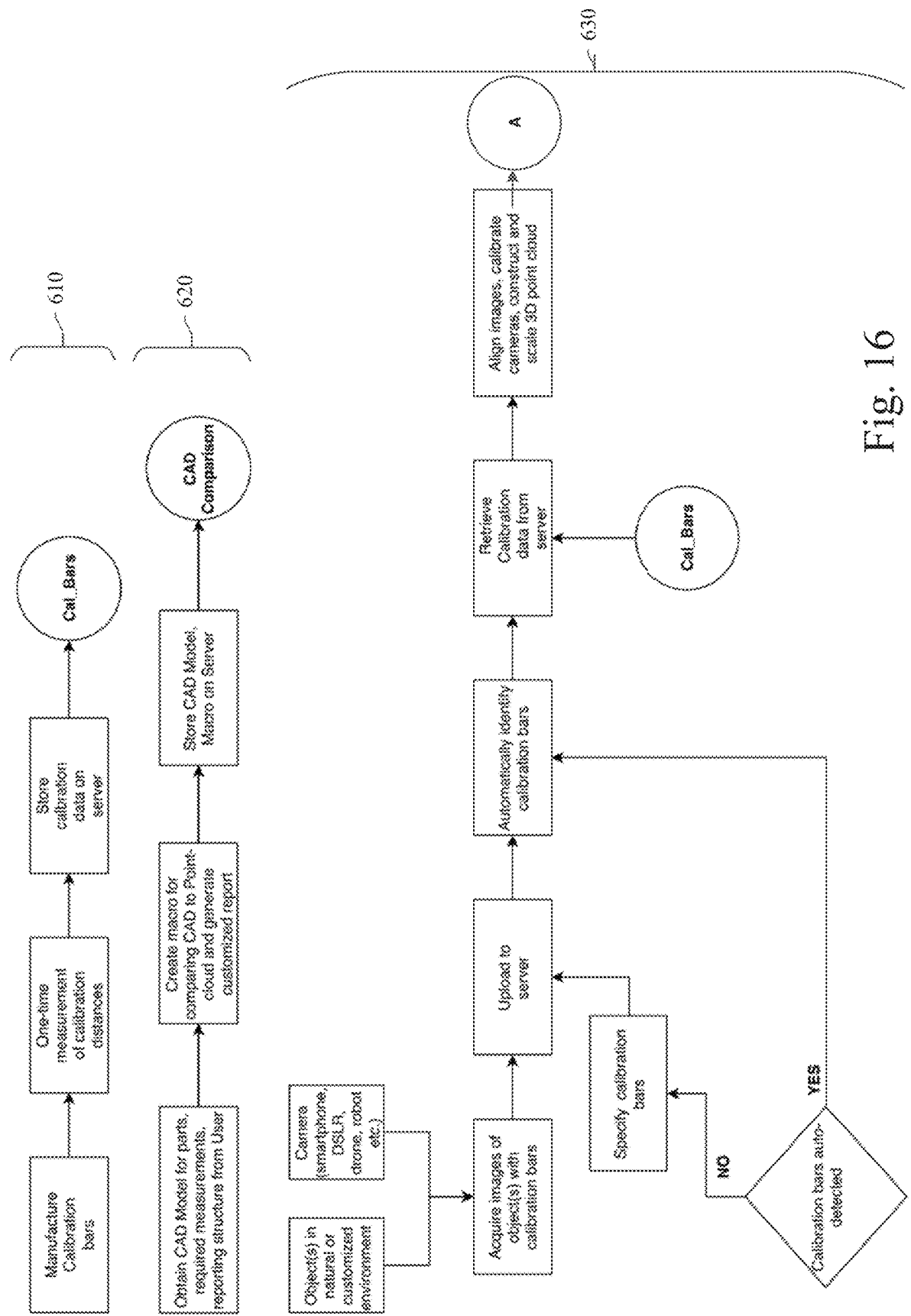
FIGS. 16 through 18 are processing flow diagrams that illustrate processes of the object metrology processing module of an example embodiment.
Figure 17:
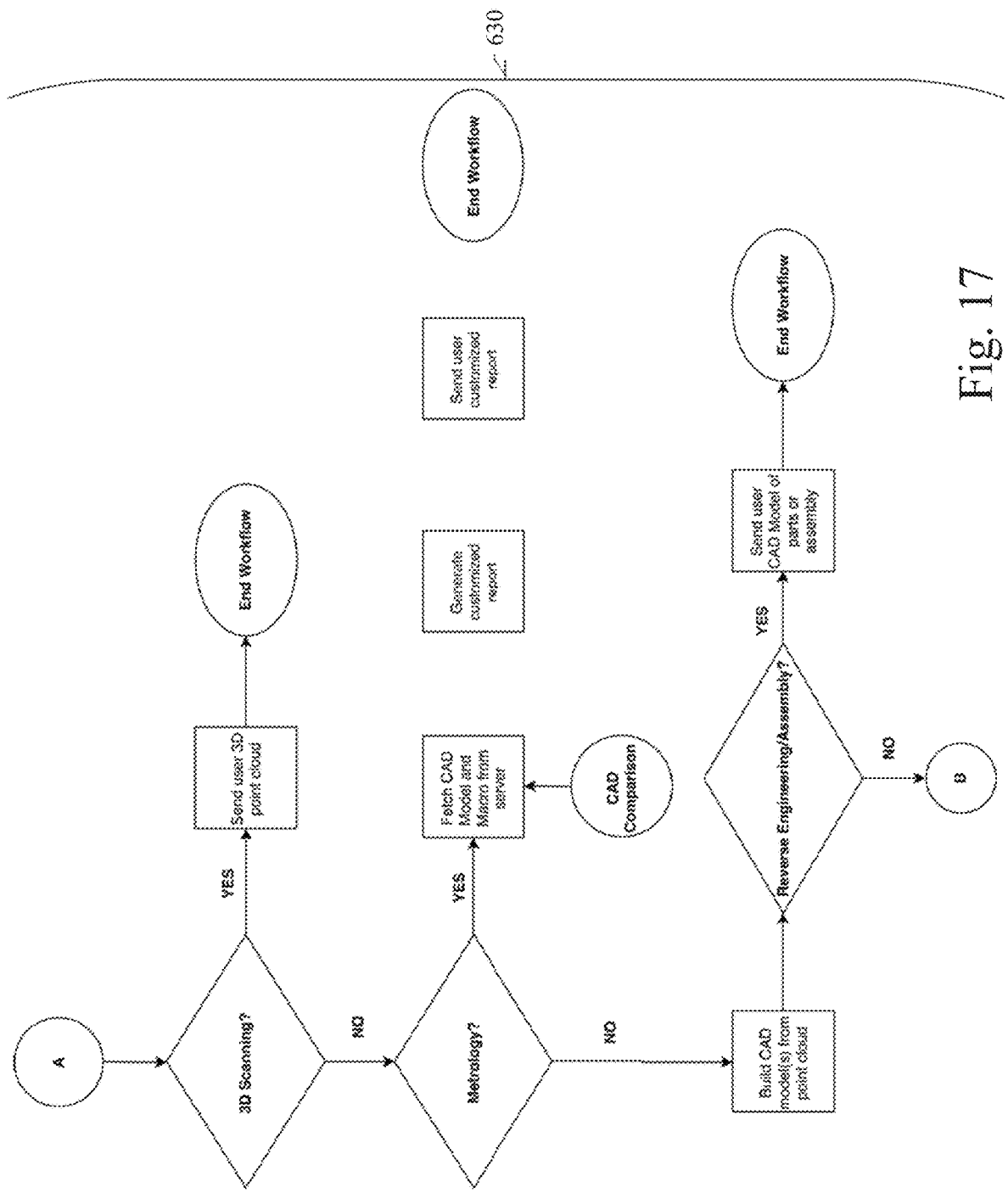
Figure 18:
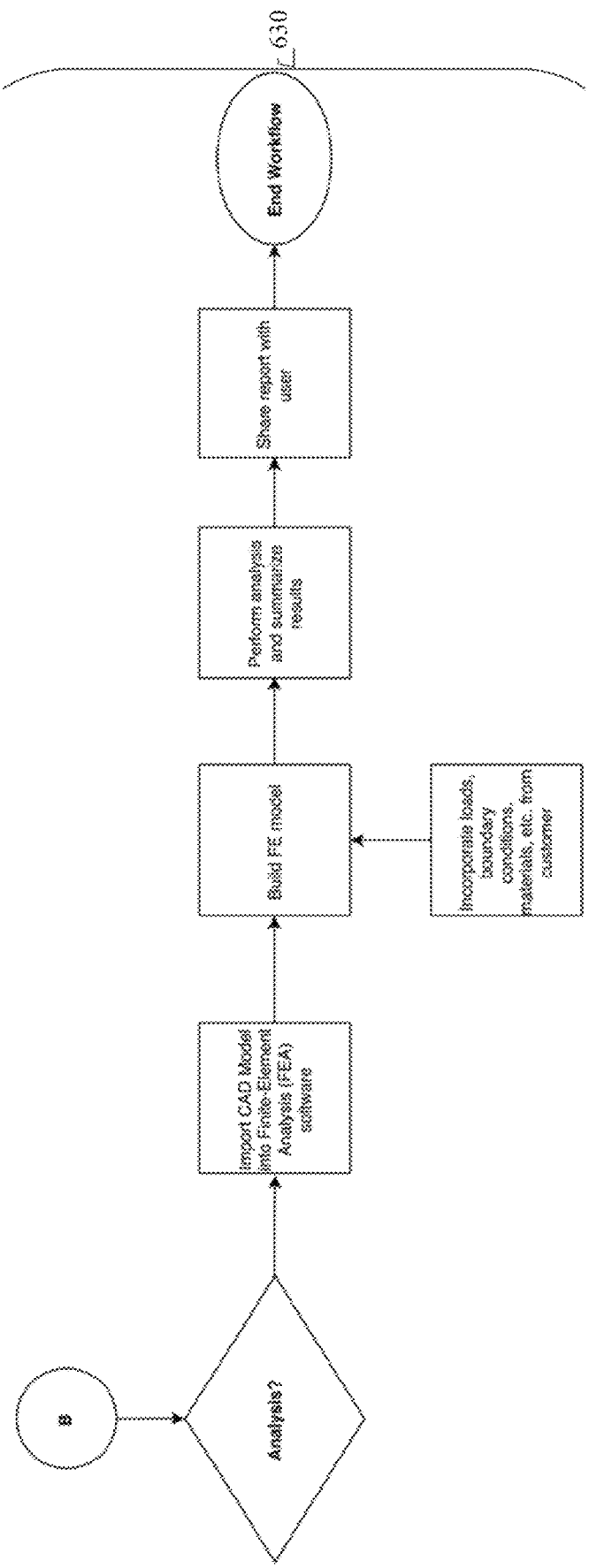

FIGS. 16 through 18 are processing flow diagrams that illustrate processes of the object metrology processing module 210 of an example embodiment. Using these processes, the part/object images uploaded to the server 110 can be processed by the object metrology processing module 210 of an example embodiment to generate dimensionally accurate 3D models of the imaged part/object. As shown in FIG. 16, a workflow 610 can be used to generate and establish calibration distances for one or more calibration bars, which can be used in the imaging of objects. The calibration bar data can be stored in a database 112 accessible to the server 110.

As shown in FIG. 16, a workflow 620 can be used to obtain computer-aided design (CAD) models for parts or objects to be measured or analyzed. The workflow 620 can also be used to obtain required measurements and a reporting structure for the user. Additionally, the workflow 620 can also be used to create a macro for comparing the CAD data to a point cloud corresponding to the images obtained for an object or part being imaged. The CAD model and macro can be stored in a database 112 accessible to the server 110.

As shown in FIGS. 16 through 18, a workflow 630 can be used to image and measure or analyze a part or object as described above. In particular, the workflow 630 can be used to acquire images of the part/object in a metrology and analysis studio platform or in the part or object's natural environment. In various example embodiments, the parts/objects can be imaged with or without a calibration bar. The set of object images can be uploaded to the server 110. The presence of the calibration bars in the set of object images can be automatically detected or explicitly specified by a user. The calibration bar data corresponding to the automatically detected or explicitly specified calibration bars can be retrieved from the database 112. The calibration bar data can be used to align the object images, calibrate the cameras, and construct and scale a 3D point cloud corresponding to the part/object shown in the set of object images.

As shown in FIG. 17, the workflow 630 continues after the 3D point cloud corresponding to the part/object is generated. If the user specifies the desire for 3D scanning, the 3D point cloud can be sent or provided to the user. If the user specifies the desire for metrology of the imaged object, the CAD model and corresponding macro can be fetched from the database 112. The CAD model and corresponding macro can be used to generate metrology data corresponding to the imaged object. The metrology data and the 3D point cloud of the object can be sent or provided to the user. If the user specifies the desire for reverse engineering or object assembly data, a CAD model for the imaged part/object can be generated from the 3D point cloud corresponding to the part/object. Reverse engineering or object assembly data can be generated from the CAD model and the 3D point cloud corresponding to the part/object. The reverse engineering and/or object assembly data of the object can be sent or provided to the user.

As shown in FIG. 18, if the user specifies the desire for analysis data corresponding to the imaged part/object, a CAD model of the imaged part/object can be provided to a Finite-Element Analysis (FEA) system. The FEA system can build a finite-element (FE) model of the part/object from the CAD model of the part/object. Related boundary conditions, loads, materials, etc. can be obtained from the user. The FEA system can generate analysis data corresponding to the imaged part/object from the FE model. The analysis data of the object can be sent or provided to the user.

In each of the workflows as described herein, the processes automatically remove all extraneous objects as well as the marker or calibration bar and to produce a 3D model of only the imaged part/object. The processes typically produce several million 3D points that correspond to the point cloud of the imaged part/object. As a result, the workflows as described herein can produce among the following results:

(1) 3D Scanning: If point scans are the desired output, then the 3D point clouds corresponding to the part/object are returned to the user by the server 110, either by email or weblink.
(2) Reverse Engineering: In another embodiment, the object image scans can be further processed to produce a CAD model, which can be used to generate object reverse engineering data. This object reverse engineering data can be used by a user to manufacture the part/object using modern manufacturing equipment, such as Computer Numerical Control (CNC) machines or computer controlled machine tools. This object reverse engineering data is particularly useful for broken, obsolete, or competitor's parts for which CAD models do not exist or are inaccessible.
(3) Metrology: In another embodiment, the object image scans can be used to compare the scan with the CAD model of the part provided by the user to understand the deviations of the actual scanned unit from the CAD geometry, which represents the ideal outcome. This metrology data can be used as an in-process quality monitor or an end-of-line quality control tool. The deviations of the analyzed or measured part from the CAD geometry may be superimposed on the CAD model and displayed using Augmented Reality (AR) or Virtual Reality (VR) tools to the user.
(4) Assembly: In another embodiment, the object image scans can be used to compare the CAD models of mating parts generated from the point scans by the embodiments described herein and understand if these parts can be assembled together.
(5) Analysis: In another embodiment, the object image scans can be used to analyze the generated CAD models using numerical tools, such as finite element analysis (FEA) to understand the stresses and strains generated during assembly and field use.

Figure 19:
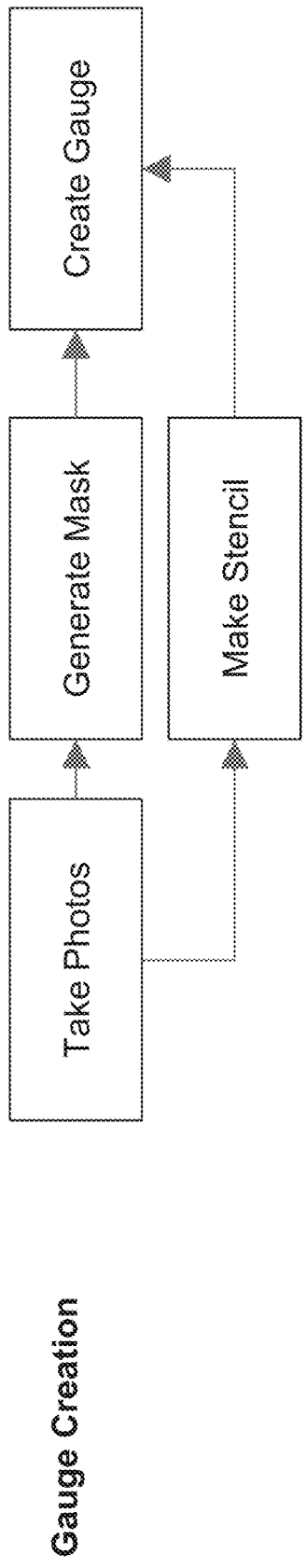
FIG. 19 is a processing flow diagram that illustrates the gauge creation features of the object metrology processing module of an example embodiment.

Referring now to FIG. 19, a processing flow diagram illustrates the gauge creation features of the object metrology processing module 210. In an example embodiment, the object metrology processing module 210 can generate a user interface via a client device of user platform 140 to provide the client device user with an option to create a gauge as an initial operation prior to enabling a user to conduct a part/object measurement operation. In an example embodiment, the gauge creation feature is used by a client device administrative user to create guidelines for users to instruct users on the processes for configuring the object metrology processing module 210 to automatically capture photos or images of a part/object being analyzed. In an example embodiment, the guidelines can include information and direction related to the use of stencils, the various camera modes, the focus parameters, and other configuration or operational information associated with the image capture device, the studio, or other aspects of the image capturing process.

Figure 20:
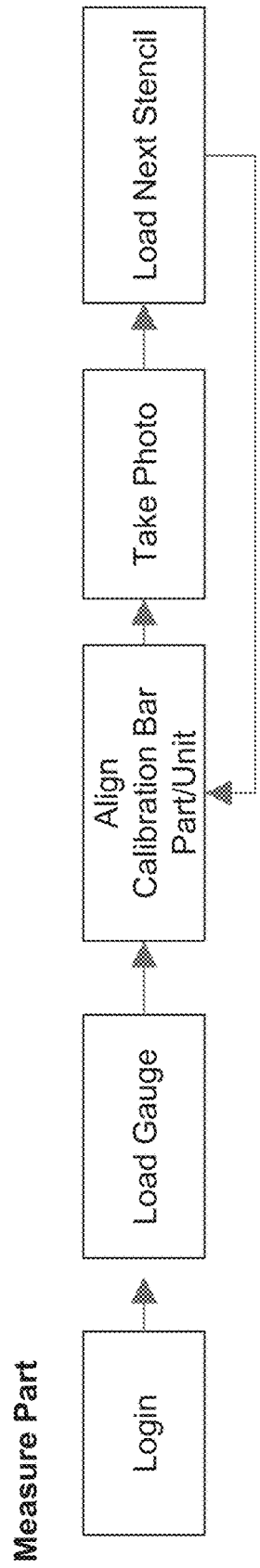
FIG. 20 is a processing flow diagram that illustrates the part/object measurement features of the object metrology processing module of an example embodiment.

FIG. 20 is a processing flow diagram that illustrates the part/object measurement features of the object metrology processing module 210 of an example embodiment. In an example embodiment, the object metrology processing module 210 can generate a user interface via a client device of user platform 140 to provide the client device user with an option to conduct a part/object measurement operation. As shown in FIG. 20, the user can be prompted to login and load a gauge created in the gauge creation process described above. Next, the user can be prompted to align a calibration bar with the part/object being analyzed. A calibration bar can be provided with the metrology and analysis studio platform 120 as described above. The alignment of the part/object can include aligning the part/object with a stencil. In an example embodiment, an ArUco marker or other photogrammetric markers can be used to facilitate the alignment and assist the user to place the camera of the mobile imaging device 124 in the appropriate position. As well-known to those of ordinary skill in the art, an ArUco marker is a synthetic square marker composed by a wide black border and an inner binary matrix, which determines its identifier (id). The black border facilitates its fast detection in the image and the binary codification allows its identification and the application of orientation and alignment techniques. The object metrology processing module 210 can perform an alignment check to verify that the part/object to be analyzed has been properly aligned with the stencil.

In a manual mode of operation, the object metrology processing module 210 can assist the user to manually take pictures of the part/object once the part/object is aligned with the stencil. The object metrology processing module 210 can provide this user assistance via a user interface and associated prompts on the mobile imaging device 124. In an automated mode of operation, the object metrology processing module 210 can generate and issue commands to the turntable 122 for rotation of the turntable 122 and the part/object thereon to a particular orientation or view for the camera of the mobile imaging device 124. After rotation of the turntable 122 is complete, the mobile imaging device 124 can receive a response signal back from the turntable 122 indicating the turntable 122 has completed the rotation to the desired position. Then, the mobile imaging device 124 can automatically capture an image or a plurality of images of the part/object being analyzed at the particular rotation of the turntable 122 and exposing a particular orientation or view of the part/object. As shown in FIG. 20, the mobile imaging device 124 can automatically take a photo or image of the part/object and then load a stencil for the next image in a sequence of images of the part/object being analyzed. The automatic image capture process of the object metrology processing module 210 can continue without user intervention until a previously specified number or quantity of images in the sequence of images of the part/object have been captured.

Figure 21:
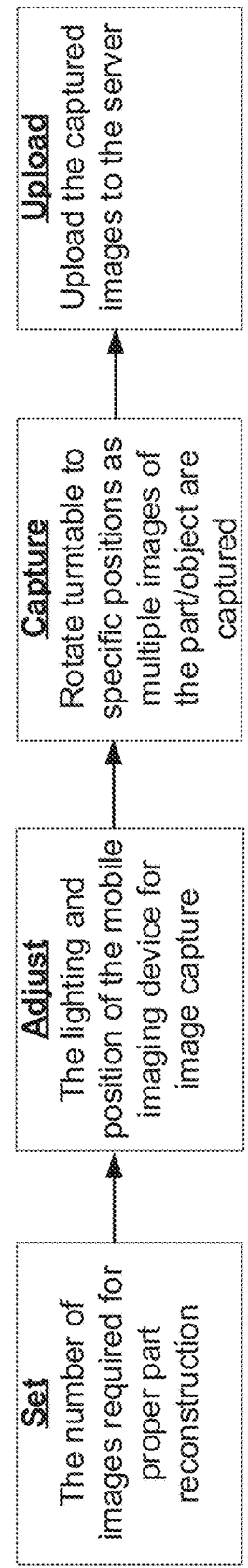
FIG. 21 is an operational process flow diagram that illustrates the part/object measurement features of the object metrology processing module of an example embodiment.

As shown in FIG. 21, the operational process flow in an example embodiment can start with a user specifying a number or quantity of images of a particular part/object to be acquired to accomplish proper 3D model reconstruction of the part/object. The object metrology processing module 210 can also automatically adjust the lighting or prompt the user to adjust the lighting in the metrology and analysis studio platform 120 to properly illuminate the part/object for image capture. In an automated mode of operation, the object metrology processing module 210 can automatically adjust the lighting in the metrology and analysis studio platform 120 to properly illuminate the part/object for each image capture. As described above, the object metrology processing module 210 can also generate and issue commands to the turntable 122 for rotation of the turntable 122 and the part/object thereon to a particular orientation or view for the camera of the mobile imaging device 124. As also described above, the mobile imaging device 124 can automatically capture a sequence of photos or images of the part/object, automatically loading a new stencil and rotating the turntable 122 for each image capture. The automatic image capture process of the object metrology processing module 210 can continue without user intervention until the previously specified number or quantity of images in the sequence of images of the part/object have been captured. Once the complete sequence of photos or images of the part/object have been captured, the object metrology processing module 210 can upload the image sequence to the server 110 for processing and analysis. The object metrology processing module 210 can perform an image quality check prior to uploading the images to make sure only good quality images are uploaded to server 110. The image quality check can include validation of the images in the image sequence for focus, overexposure, underexposure, speckling, and the like. The server 110 can use the uploaded image sequence to generate a 3D model of the object from the images of the object.

The server 110 can generate measurements of the edges and surfaces or other metrology results of the part/object from the 3D model and/or the image sequence. The server 110 can also generate information showing any deviation between actual part/object dimensions and corresponding 3D model dimensions. The server 110 can also generate information indicative of the status of the measurement result, such as pass/fail results. In an example embodiment, the user can receive detailed information related to the metrology results in the form of tables, images, or the like. The metrology results, deviation information, and other output related to the metrology of the part/object as generated by the mobile imaging system 200 of the various example embodiments can be provided to the user via the mobile imaging device 124, another mobile device, email, web browser, or other presentation platform.

Figure 22:
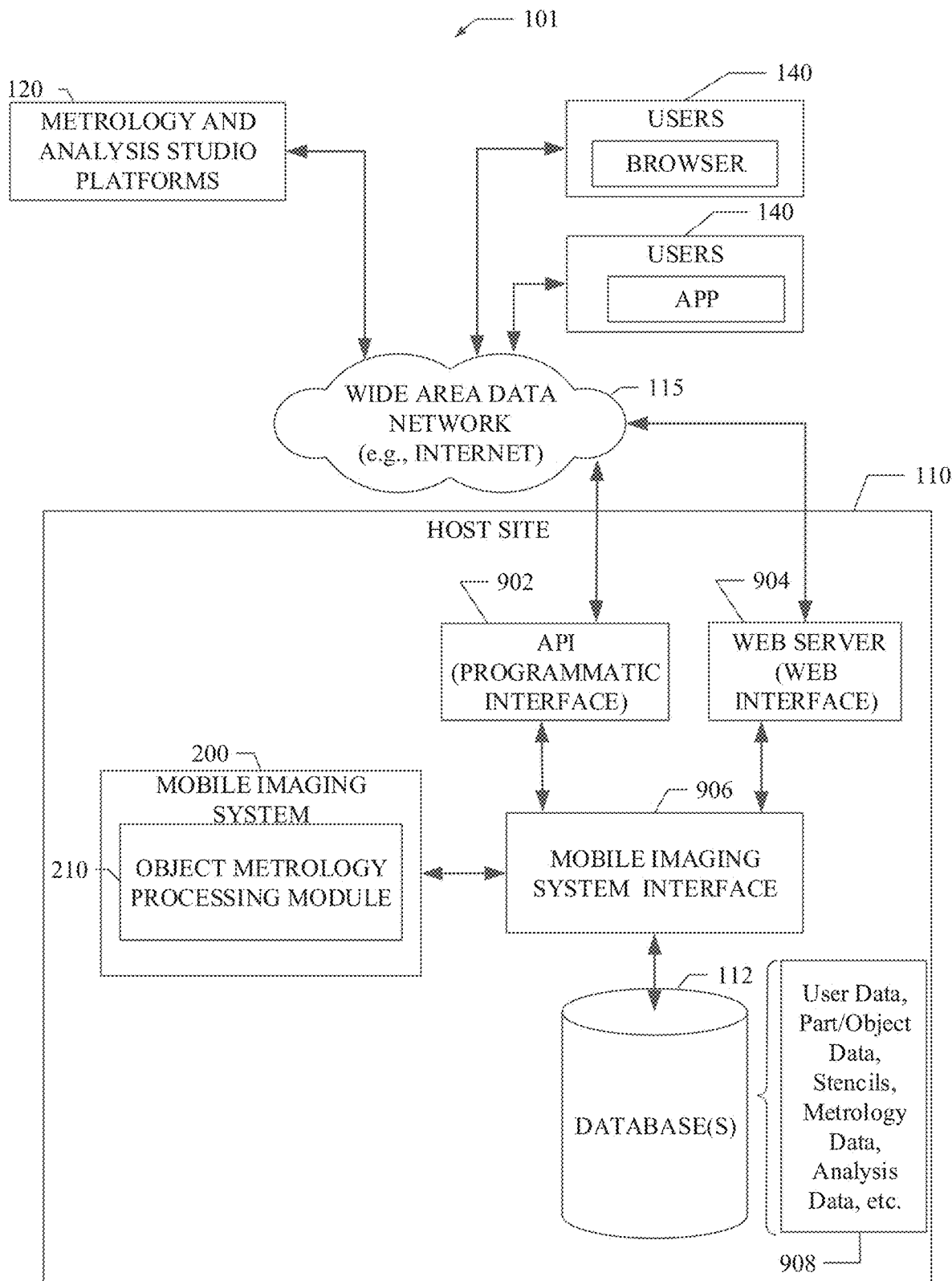
FIG. 22 illustrates another example embodiment of a networked system in which various embodiments may operate.

Referring now to FIG. 22, another example embodiment 101 of a networked system in which various embodiments may operate is illustrated. In the embodiment illustrated, the host site 110 is shown to include the mobile imaging system 200. The mobile imaging system 200 is shown to include the object metrology processing module 210 as described above. In a particular embodiment, the host site 110 may also include a web server 904, having a web interface with which users may interact with the host site 110 via a user interface or web interface. The host site 110 may also include an application programming interface (API) 902 with which the host site 110 may interact with other network entities on a programmatic or automated data transfer level. The API 902 and web interface 904 may be configured to interact with the mobile imaging system 200 either directly or via an interface 906. The mobile imaging system 200 may be configured to access a data storage device 112 either directly or via the interface 906.

Thus, as described for various example embodiments, a system and method for using images from a commodity camera for object scanning, reverse engineering, metrology, assembly, and analysis are disclosed. In the various example embodiments described herein, a computer-implemented device including a software application (app) as part of a mobile imaging system is described to automate and improve object measurement and analysis processes. The various embodiments described herein can be expanded in a variety of ways to provide additional features and services. Some of these expanded features and services are provided to create and manage a secure infrastructure in a cloud environment to provide computational resources and technology services for generating 3D models of parts/objects being measured or analyzed and distributing measurement or analysis reports across platforms. Various example embodiments can also provide the following features and services:

API services across platforms for interaction with user content and data access

Data storage services using industrial grade services

Continuous integration and deployment of all services over cloud infrastructure

Communication of all components and resources using authentication and authorization over secure channel.

Periodic, logical backups for disaster recovery

Horizontal scaling of complete infrastructure

Version control system for application code management

24/7 availability of infrastructure

Data persistence services in RDBMS

The various embodiments described herein can provide a variety of benefits. For example, the various embodiments can provide among the following benefits and capabilities:

Using a smartphone for computer aided design (CAD)-to-geometry comparison

One-touch scaled 3D geometry measurement using a smartphone

Real-time image quality/fitness assessment for reconstruction

Stencil-based user guidance system

First sub-mm-accurate 3D reconstruction pipeline

First smartphone-based reverse engineering pipeline (images-to-CAD model generation)

Parallelizable workflow with minimal hardware change

Automatic camera position system for perfect reconstruction (e.g., using ArUco)

Visualization of results using augmented reality (AR) on the phone

Drone-based CAD-to-geometry comparison pipeline

Fully autonomous CAD-to-geometry pipeline

Figure 23:
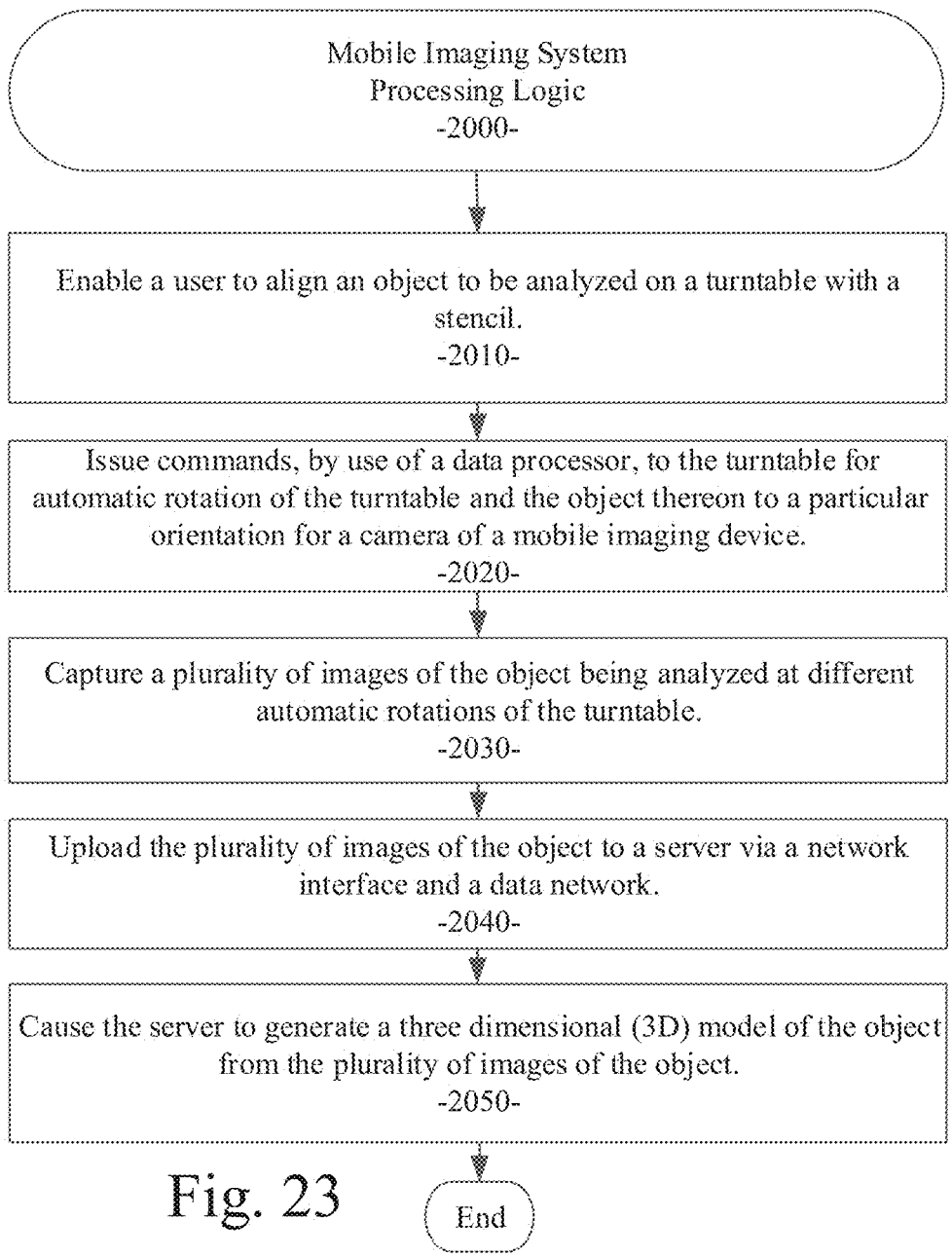
FIG. 23 illustrates a processing flow diagram that illustrates example embodiments of methods as described herein.

Base with photogrammetric markers (e.g. ArUco), laser speckles/structured light projector, turntable, X-Y-theta stage, smartphone, custom lighting Referring now to FIG. 23, a processing flow diagram illustrates an example embodiment of a method implemented by the mobile imaging system 200 as described herein. The method 2000 of an example embodiment can be configured to: enable a user to align an object to be analyzed on a turntable with a stencil (processing block 2010); issue commands, by use of a data processor, to the turntable for automatic rotation of the turntable and the object thereon to a particular orientation for a camera of a mobile imaging device (processing block 2020); capture a plurality of images of the object being analyzed at different automatic rotations of the turntable (processing block 2030); upload the plurality of images of the object to a server via a network interface and a data network (processing block 2040); and cause the server to generate a three dimensional (3D) model of the object from the plurality of images of the object (processing block 2050).

Figure 24:
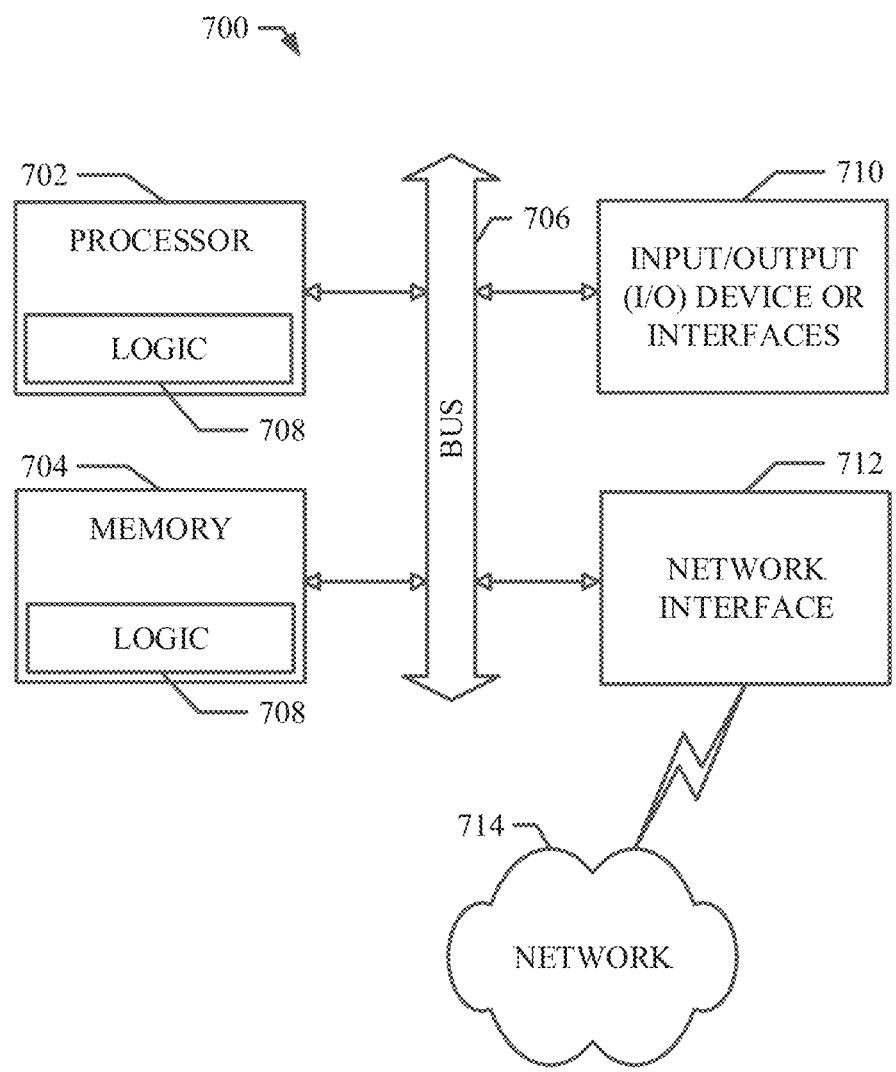
FIG. 24 shows a diagrammatic representation of a machine in the example form of a computer system within which a set of instructions when executed may cause the machine to perform any one or more of the methodologies discussed herein.

FIG. 24 shows a diagrammatic representation of a machine in the example form of a mobile computing and/or communication system 700 within which a set of instructions when executed and/or processing logic when activated may cause the machine to perform any one or more of the methodologies described and/or claimed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a laptop computer, a tablet computing system, a Personal Digital Assistant (PDA), a cellular telephone, a smartphone, a web appliance, a set-top box (STB), a network router, switch or bridge, or any machine capable of executing a set of instructions (sequential or otherwise) or activating processing logic that specify actions to be taken by that machine. Further, while only a single machine is illustrated, the term "machine" can also be taken to include any collection of machines that individually or jointly execute a set (or multiple sets) of instructions or processing logic to perform any one or more of the methodologies described and/or claimed herein.

The example mobile computing and/or communication system 700 includes a data processor 702 (e.g., a System-on-a-Chip (SoC), general processing core, graphics core, and optionally other processing logic) and a memory 704, which can communicate with each other via a bus or other data transfer system 706. The mobile computing and/or communication system 700 may further include various input/output (I/O) devices and/or interfaces 710, such as a touchscreen display, an audio jack, and optionally a network interface 712. In an example embodiment, the network interface 712 can include one or more radio transceivers configured for compatibility with any one or more standard wireless and/or cellular protocols or access technologies (e.g., 2nd (2G), 2.5, 3rd (3G), 4th (4G) generation, and future generation radio access for cellular systems, Global System for Mobile communication (GSM), General Packet Radio Services (GPRS), Enhanced Data GSM Environment (EDGE), Wideband Code Division Multiple Access (WCDMA), LTE, CDMA2000, WLAN, Wireless Router (WR) mesh, and the like). Network interface 712 may also be configured for use with various other wired and/or wireless communication protocols, including TCP/IP, UDP, SIP, SMS, RTP, WAP, CDMA, TDMA, UMTS, UWB, WiFi, WiMax, Bluetooth™, IEEE 802.11x, and the like. In essence, network interface 712 may include or support virtually any wired and/or wireless communication mechanisms by which information may travel between the mobile computing and/or communication system 700 and another computing or communication system via network 714.

The memory 704 can represent a machine-readable medium on which is stored one or more sets of instructions, software, firmware, or other processing logic (e.g., logic 708) embodying any one or more of the methodologies or functions described and/or claimed herein. The logic 708, or a portion thereof, may also reside, completely or at least partially within the processor 702 during execution thereof by the mobile computing and/or communication system 700. As such, the memory 704 and the processor 702 may also constitute machine-readable media. The logic 708, or a portion thereof, may also be configured as processing logic or logic, at least a portion of which is partially implemented in hardware. The logic 708, or a portion thereof, may further be transmitted or received over a network 714 via the network interface 712. While the machine-readable medium of an example embodiment can be a single medium, the term "machine-readable medium" should be taken to include a single non-transitory medium or multiple non-transitory media (e.g., a centralized or distributed database, and/or associated caches and computing systems) that stores the one or more sets of instructions. The term "machine-readable medium" can also be taken to include any non-transitory medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

As described herein for various example embodiments, a system and method for using images from a commodity camera for object scanning, reverse engineering, metrology, assembly, and analysis are disclosed. In various embodiments, a software application program is used to enable the capture and processing of images on a computing or communication system, including mobile devices. As described above, in a variety of contexts, the mobile imaging system 200 of an example embodiment can be configured to automatically capture images of a part/object being measured or analyzed, all from the convenience of a portable electronic device, such as a smartphone. This collection images can be processed and results can be distributed to a variety of network users. As such, the various embodiments as described herein are necessarily rooted in computer and network technology and serve to improve these technologies when applied in the manner as presently claimed. In particular, the various embodiments described herein improve the use of mobile device technology and data network technology in the context of automated object measurement and analysis via electronic means.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system comprising:
   a mobile imaging device having a data processor and a camera;
   a network interface, in data communication with the data processor, for communication on a data network; and
   a mobile imaging system, executable by the data processor, to:
      use the camera of the mobile imaging device to capture a plurality of images of external surfaces of an object being analyzed at different orientations adjacent to a calibration bar;
      upload the plurality of images of the object to a server via the network interface and the data network;
      cause the server to generate a three dimensional (3D) model of the object from the plurality of images of the object;
      cause the server to compare the 3D model of the object with a corresponding computer-aided design (CAD) geometry of the object;
      cause the server to generate metrology information from the plurality of images and the 3D model of the object, the metrology information including information corresponding to deviations of the 3D model of the object from the corresponding CAD geometry of the object, the metrology information further including measurements of edges and surfaces of the object, object point scan data, and object reverse engineering data generated from the object point scan data; and
      cause the server to provide the metrology information to a user of a user platform via the data network.

2. The system of claim 1 wherein the plurality of images are extracted from a video.

3. The system of claim 1 wherein the metrology information further including information showing any deviation between scanned object dimensions and corresponding 3D CAD model dimensions.

4. The system of claim 1 wherein the metrology information further including object assembly guidance and object analysis information.

5. The system of claim 1 wherein the mobile imaging device is a device of a type from the group consisting of: a personal computer (PC), a portable computing device, a mobile device, a laptop computer, a tablet computer, a personal digital assistant (PDA), a personal communication device, a cellular telephone, a smartphone, a wireless device, a network computer, and a consumer electronic device.

6. The system of claim 1 being further configured to analyze the plurality of images of the object for focus, lighting, and contrast.

7. The system of claim 1 being further configured to use an ArUco marker or other photogrammetric markers to facilitate alignment of the object.

8. The system of claim 1 being further configured to automatically adjust lighting in a metrology and analysis studio platform to properly illuminate the object for each image capture.

9. The system of claim 1 being further configured to capture the plurality of images of the object being analyzed at different automatic rotations of a turntable without user intervention.

10. The system of claim 1 being further configured to capture the plurality of images of the object being analyzed with a commodity camera.

11. The system of claim 1 being further configured to capture the plurality of images of the object being analyzed with a drone camera.

12. The system of claim 1 being further configured to capture the plurality of images of the object being analyzed with a robotic-arm based camera.

13. The system of claim 1 being further configured to use a colored screen to aid in isolating the object of interest from a cluttered background.

14. The system of claim 1 being further configured to provide real-time image quality or fitness assessments for object reconstruction.

15. The system of claim 1 being further configured to superimpose an image of a stencil on an image of an object for object alignment.

16. The system of claim 1 being further configured to superimpose an image of a stencil on an image of an object in an augmented reality or virtual reality environment for object alignment.

17. A method comprising:
   using a camera of a mobile imaging device to capture a plurality of images of external surfaces of an object being analyzed at different orientations adjacent to a calibration bar;
   uploading the plurality of images of the object to a server via a network interface and a data network;
   causing the server to generate a three dimensional (3D) model of the object from the plurality of images of the object;
   causing the server to compare the 3D model of the object with a corresponding computer-aided design (CAD) geometry of the object;
   causing the server to generate metrology information from the plurality of images and the 3D model of the object, the metrology information including information corresponding to deviations of the 3D model of the object from the corresponding CAD geometry of the object, the metrology information further including measurements of edges and surfaces of the object, object point scan data, and object reverse engineering data generated from the object point scan data; and
   causing the server to provide the metrology information to a user of a user platform via the data network.

18. The method of claim 17 wherein the plurality of images are extracted from a video.

19. The method of claim 17 wherein the mobile imaging device is a device of a type from the group consisting of: a personal computer (PC), a portable computing device, a mobile device, a laptop computer, a tablet computer, a personal digital assistant (PDA), a personal communication device, a cellular telephone, a smartphone, a wireless device, a network computer, and a consumer electronic device.

20. The method of claim 17 including providing real-time image quality or fitness assessments for object reconstruction.

* * * * *